(12) United States Patent
Fürgut et al.

(10) Patent No.: US 12,707,957 B2
(45) Date of Patent: Aug. 11, 2026

(54) SILICON CARBIDE DEVICE AND METHOD FOR FORMING A SILICON CARBIDE DEVICE

(71) Applicant: Infineon Technologies AG, Neubiberg (DE)

(72) Inventors: Edward Fürgut, Dasing (DE); Ravi Keshav Joshi, Klagenfurt am Wörthersee (AT); Thomas Basler, Chemnitz (DE); Martin Gruber, Schwandorf (DE); Jochen Hilsenbeck, Villach (AT); Wolfgang Scholz, Olching (DE)

(73) Assignee: Infineon Technologies AG, Neubiberg (DE)

(*) Notice: Subject to any disclaimer, the term of this patent is extended or adjusted under 35 U.S.C. 154(b) by 34 days.

(21) Appl. No.: 18/526,127

(22) Filed: Dec. 1, 2023

(65) Prior Publication Data

US 2024/0113026 A1 Apr. 4, 2024

Related U.S. Application Data

(63) Continuation of application No. 17/752,224, filed on May 24, 2022, now Pat. No. 11,869,840, which is a (Continued)

(30) Foreign Application Priority Data

Jul. 3, 2018 (DE) ........................ 102018116102.6

(51) Int. Cl.
*H10W 20/41* (2026.01)
*H10D 62/832* (2025.01)
(Continued)

(52) U.S. Cl.
CPC ...... *H10W 20/425* (2026.01); *H10D 62/8325* (2025.01); *H10D 64/62* (2025.01);
(Continued)

(58) Field of Classification Search
CPC ........... H01L 23/53238; H01L 21/7685; H01L 24/45; H01L 2224/05172;
(Continued)

(56) References Cited

U.S. PATENT DOCUMENTS 4,922,321 A 5/1990 Arai et al.
5,250,472 A 10/1993 Chen et al.
(Continued)

FOREIGN PATENT DOCUMENTS

CN 104538294 * 4/2015
DE 19840239 A1 3/2000
(Continued)

OTHER PUBLICATIONS

Hymes et al. ("Passivation of Copper by Silicide Formation in Dilute Silane," J. Appl. Phys., 71 pp. 4623-4625, 1992) (Year: 1992).*

(Continued)

*Primary Examiner* — Yasser A Abdelaziez
(74) *Attorney, Agent, or Firm* — Murphy, Bilak & Homiller, PLLC

(57) ABSTRACT

A silicon carbide device includes a silicon carbide substrate, a contact layer located on the silicon carbide substrate and including nickel and silicon, a barrier layer structure including titanium and tungsten, and a metallization layer comprising copper, wherein the contact layer is located between the silicon carbide substrate and at least a part of the barrier layer structure, wherein the barrier layer structure is located between the silicon carbide substrate and the metallization
(Continued)

layer, wherein the metallization layer is configured as a contact pad of the silicon carbide device.

24 Claims, 12 Drawing Sheets

Related U.S. Application Data continuation of application No. 16/453,222, filed on Jun. 26, 2019, now Pat. No. 11,367,683.

(51) Int. Cl.
*H10D 64/62* (2025.01)
*H10W 20/00* (2026.01)
*H10W 72/50* (2026.01)
*H10W 72/90* (2026.01)

(52) U.S. Cl.
CPC ........ *H10W 20/038* (2026.01); *H10W 72/552* (2026.01); *H10W 72/5522* (2026.01); *H10W 72/5525* (2026.01); *H10W 72/923* (2026.01); *H10W 72/952* (2026.01)

(58) Field of Classification Search
CPC . H01L 2224/05179; H01L 2224/05181; H01L 2224/05672; H01L 2224/05679; H01L 2224/45139; H01L 2224/45144; H01L 2224/45147; H01L 2224/04042; H01L 2224/05166; H01L 2224/05184; H01L 2224/05186; H01L 2224/05624; H01L 2224/05647; H01L 2224/0603; H01L 2224/45015; H01L 2224/45124; H01L 2224/48247; H01L 2224/48465; H01L 2224/48724; H01L 2224/48824; H01L 2224/49111; H01L 2224/85207; H01L 2924/10272; H01L 2924/12032; H01L 2924/13055; H01L 2924/13062; H01L 2924/13091; H01L 21/0485; H01L 24/05; H01L 24/48; H01L 24/49; H10D 62/8325; H10D 64/62; H10D 12/481; H10D 62/393
See application file for complete search history.

(56) References Cited

U.S. PATENT DOCUMENTS 5,523,626 A 6/1996 Hayashi et al.
6,569,767 B1* 5/2003 Fujisawa ................. H01L 24/48 257/E23.161
6,599,644 B1 7/2003 Zekentes et al.
6,620,721 B1 9/2003 Lee
10,236,265 B2* 3/2019 Kramp .................... H01L 24/06
10,590,520 B2* 3/2020 Smarsly .................. C22F 1/183
2002/0000665 A1 1/2002 Barr et al.
2003/0183895 A1 10/2003 Okamura et al.
2005/0077626 A1* 4/2005 Seiller ..................... H01L 24/48 257/E23.152
2007/0235887 A1* 10/2007 Kaimori ............... B23K 20/007 257/784
2008/0081458 A1* 4/2008 Lin ......................... H01L 24/11 438/620
2008/0224317 A1* 9/2008 Machkaoutsan ............................ H01L 21/28518 257/E23.141
2008/0286915 A1 11/2008 Dungan et al.
2008/0296681 A1* 12/2008 Georgakos ............. H10D 30/62 257/365
2009/0079010 A1 3/2009 Deloach et al.
2009/0152725 A1 6/2009 Dalal et al.
2010/0123172 A1* 5/2010 Fujikawa ............. H10D 62/111 257/280
2011/0227155 A1 9/2011 Su et al.
2011/0309508 A1* 12/2011 Cabral, Jr. ......... H10D 64/0112 438/653
2013/0099308 A1 4/2013 Gruber et al.
2014/0083493 A1 3/2014 Zhu
2014/0138705 A1 5/2014 Zhang et al.
2014/0183557 A1* 7/2014 Kang ..................... H10D 64/62 438/653
2014/0299890 A1 10/2014 Matocha et al.
2015/0228723 A1 8/2015 Werber et al.
2015/0236175 A1 8/2015 Kapur et al.
2015/0371928 A1 12/2015 Chen et al.
2016/0233164 A1 8/2016 Choi et al.
2016/0303003 A1 10/2016 Hale et al.
2017/0207331 A1 7/2017 Nakanishi et al.
2017/0221998 A1 8/2017 Ebihara et al.
2017/0330859 A1 11/2017 Soares et al.
2017/0345711 A1* 11/2017 Roth ................. H01L 21/76877
2018/0190651 A1 7/2018 Siemieniec et al.
2019/0057873 A1 2/2019 Sugahara et al.
2020/0013722 A1* 1/2020 Hille ................. H01L 21/76898

FOREIGN PATENT DOCUMENTS

DE 102004012819 B4 2/2006
DE 102008019599 A1 10/2008
DE 112007000697 T5 2/2009
DE 102008035537 A1 4/2009
DE 102009010891 A1 8/2010
DE 102014109475 A1 1/2015
DE 102014117297 A1 5/2015
DE 102016109713 A1 11/2017

OTHER PUBLICATIONS

Klein et al. ("Silicon distribution and silicide precipitation during annealing in an advanced multi-phase-TiAl based alloy," Acta Materialia, vol. 110, 15, pp. 236-245, May 15, 2016) (Year: 2016).*
Knoll, Lars, et al., "Gate-all-around Si nanowire array tunnelling FETs with high on-current of 75 μAlμm @ VDD=1.1 V", IEEE 14th International Conference on Ultimate Integration on Silicon (ULIS), 2013, 97-100.
Koh, Alvin Tian-Yi, "Nickel-Aluminum Alloy Silicides with High Aluminum Content for Contact Resistance Reduction and Integration in n-Channel Field-Effect Transistors", Journal of the Electrochemical Society, 2008, H151-H155.

* cited by examiner

SILICON CARBIDE DEVICE AND METHOD FOR FORMING A SILICON CARBIDE DEVICE

TECHNICAL FIELD

Examples relate to silicon carbide devices and to a method for forming silicon carbide devices. Further aspects described herein relate to power semiconductor devices, e.g. silicon carbide devices, having an improved thermal robustness.

BACKGROUND

When developing power devices, ever higher power densities may be requested. While there are limitations with silicon-based power devices due to limitations of the material, with silicon carbide devices, five to ten times higher power densities may be achievable.

There may be a demand to provide an improved concept for silicon carbide devices, which enables silicon carbide devices with reduced lateral dimensions. Further, there may be a need for further improvement, particularly for improving the thermal robustness of wide bandgap power devices, e.g. silicon carbide devices.

SUMMARY

Some embodiments relate to a silicon carbide device comprising a silicon carbide substrate. The silicon carbide device comprises a contact layer comprising nickel, silicon and aluminum. The contact layer is located on the silicon carbide substrate. The silicon carbide device comprises a barrier layer structure comprising titanium and tungsten. The contact layer is located between the silicon carbide substrate and at least a part of the barrier layer structure. The silicon carbide device comprises a metallization layer comprising copper. The barrier layer structure is located between the silicon carbide substrate and the metallization layer.

Some embodiments relate to a method for forming a silicon carbide device. The method comprises forming a contact layer comprising nickel, silicon and aluminum on a silicon carbide substrate of the silicon carbide device. The method comprises forming a barrier layer structure comprising titanium and tungsten after forming the contact layer structure. The method comprises forming a metallization layer comprising copper after forming the barrier layer structure. An ohmic connection is formed between the metallization layer and a doping region of the silicon carbide substrate via the barrier layer structure and the contact layer.

According to an embodiment, a power semiconductor device includes a semiconductor substrate having a first surface, wherein the semiconductor substrate includes a wide bandgap semiconductor material having an intrinsic temperature. An insulation layer is above the first surface of the semiconductor substrate, wherein the insulation layer includes at least one opening extending through the insulation layer in a vertical direction. A front metallization is above the insulation layer with the insulation layer being interposed between the front metallization and the first surface of the semiconductor substrate. A metal connection is arranged in the opening of the insulation layer and electrically conductively connecting the front metallization with the semiconductor substrate. The front metallization contains at least one layer or essentially consists of one layer, wherein the at least one layer essentially consists of a metal or a metal alloy having a higher melting temperature than the intrinsic temperature of the semiconductor material.

According to an embodiment, a power semiconductor device includes a semiconductor substrate having a first surface, wherein the semiconductor substrate includes a monocrystalline semiconductor material selected from a group consisting of SiC, GaN, AlN and $Ga_2O_3$. An insulation layer is on the first surface of the semiconductor substrate, wherein the insulation layer includes a plurality of openings extending through the insulation layer. A front metallization is on the insulation layer with the insulation layer being interposed between the front metallization and the first surface of the semiconductor substrate. The front metallization extends through the respective openings of the insulation layer and forms respective metal connections arranged in the respective openings of the insulation layer, wherein the metal connections form respective electrical connections to the semiconductor substrate. The front metallization contains or essentially consists of one or more metals and/or metal alloys having a melting temperature higher than 1100° C.

Those skilled in the art will recognize additional features and advantages upon reading the following detailed description, and upon viewing the accompanying drawings.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
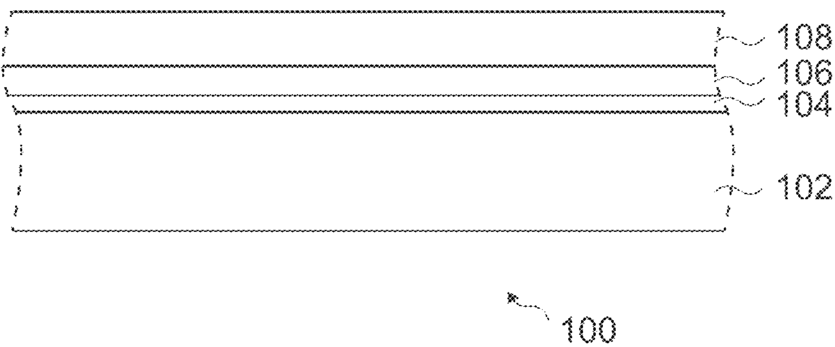
FIG. 1 shows a schematic cross section of a part of a silicon carbide device according to an embodiment.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. Furthermore, if an element is located or positioned "on" another element (e.g., a layer is "on" another layer or "on" a substrate), a further component (e.g., a further layer) may be positioned between said two elements (e.g., a further layer may be positioned between a layer and a substrate if the layer is "on" said substrate). If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly nor implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

The terms "electrical connection" and "electrically connected" describe an ohmic connection or a connection through a Schottky contact between two elements.

The term "essentially consisting of" describes that a material of an element or of a structural part mainly consists of the indicated composition or the indicated component and that the content of not-mentioned components such as impurities is less than 1%, based on the total weight of that element or that structural part.

Furthermore, if a physical value is declared with the addition "about" (such as, e.g., "about 600° C."), this is to be construed such within the typical error margins, in particular such that typical measurement errors and/or the rounding-off convention to the last decimal place are included.

Unless otherwise defined, all terms (including technical and scientific terms) are used herein in their ordinary meaning of the art to which the examples belong.

FIG. 1 shows a schematic cross section of a part of a silicon carbide device 100. The silicon carbide device 100 may comprise a silicon carbide substrate 102. The silicon carbide substrate 102 may extend in lateral directions along a main extension plane, which main extension plane may run essentially along a front side surface of the silicon carbide substrate. Perpendicular to the lateral directions, in a vertical direction, the silicon carbide substrate 102 may have a thickness that is small compared to the extension of the silicon carbide substrate 102 in the lateral directions.

The silicon carbide device 100 may be a power semiconductor device, for example. Examples relate to a power semiconductor device comprising a semiconductor substrate with a wide bandgap semiconductor material, e.g. instead of the silicon carbide substrate 102 or in addition to the silicon carbide substrate 102.

The silicon carbide (chemical symbol: SiC) device 100 may further comprise a contact layer 104. The contact layer may comprise nickel (chemical symbol: Ni), silicon (chemical symbol: Si) and aluminum (chemical symbol: Al). The contact layer 104 may be located on the silicon carbide substrate 102. For example, the contact layer 104 is located directly on the silicon carbide substrate 102. For example, the contact layer 104 may provide an ohmic contact to the silicon carbide substrate 102.

The contact layer 104 may consist of Ni, Si and Al. Here and in the following, if a component "consists of" a chemical element or several chemical elements, this means that the main constituent(s) of the component is (are) said chemical element(s), with the exception of impurities due to manufacturing tolerances. For example, if a component "consists of" a chemical element or several chemical elements, the component comprises at most 0.1% (or at most 0.05%, or at most 0.01%) in volume of other chemical elements.

Within the contact layer 104, the chemical elements Ni, Si and Al may be distributed homogeneously. That is to say, the chemical composition, in particular the atomic ratios of the chemical elements, of the contact layer 104 may vary at most ±5% along the vertical direction and/or the lateral directions. It is, however, also possible that the chemical composition, in particular the atomic ratios of the chemical elements, of the contact layer 104 varies at least along the vertical direction. For example, a content of Si may decrease with increasing distance to the silicon carbide substrate 102.

The silicon carbide device 100 (e.g. the power semiconductor device) may comprise a barrier layer structure 106 e.g. comprising titanium (chemical symbol: Ti) and tungsten (chemical symbol: W). As an alternative for the barrier layer structure 106 or in addition to the barrier layer structure 106 the silicon carbide device 100 may comprise an adhesion promoting layer, for example. For example, instead of providing or in addition to providing the barrier layer structure 106, an adhesion promoting layer may be provided in the silicon carbide device 100. The contact layer 104 may be located, for example vertically located, between the silicon carbide substrate 102 and at least a part of the barrier layer structure 106 (e.g. the adhesion promoting layer).

The silicon carbide device 100 may comprise a metallization layer 108 e.g. comprising copper (chemical symbol: Cu). The metallization layer 108 may comprise a power metal or may consist of a power metal, for example. For example, instead of providing or in addition to providing the metallization layer 108, a power metal may be provided in the silicon carbide device 100. The barrier layer structure 106 may be located, for example vertically located (i.e. located vertically), between the silicon carbide substrate 102 and the metallization layer 108 (e.g. the power metal).

The barrier layer structure 106 (e.g. the adhesion promoting layer) may act as or be a diffusion barrier, which may be suitable for hindering a diffusion of the copper of the metallization structure 108 (e.g. the power metal) into the silicon carbide substrate 102. This may enable using a copper-based metallization layer, which may comprise a high melting temperature and may thus allow silicon carbide devices with a high power density and a low footprint. At a low footprint, a capacitance of the silicon carbide device may decrease and a yield (at a constant defect density) may increase.

For example, the barrier layer structure 106 may be a diffusion barrier between the metallization layer 108 and the silicon carbide substrate 102. The barrier layer 106 may be suitable for hindering a diffusion of copper into the silicon carbide substrate 102.

In various examples, the barrier layer structure 106 may be a single barrier layer. A single barrier layer may enable a manufacturing of the silicon carbide device at a reduced complexity and/or at reduced costs. The single barrier layer may be in contact (i.e. in direct contact) with the contact layer 104 and with the metallization layer 108. In other words, the single barrier layer may be located adjacent, for example vertically adjacent, to the contact layer 104 and to the metallization layer 108.

For example, the barrier layer structure 106 may be a TiW (titanium tungsten) layer. The TiW layer may provide a diffusion barrier between the metallization layer 108 and the silicon carbide substrate 108. Alternatively, the barrier layer structure 106 may be TiWN (titanium tungsten nitride) layer. The TiWN layer may provide a stabilization of the barrier layer structure 106. For example, the TiW layer or the TiWN layer may be in contact with the metallization layer 108. In other words, the TiW layer or the TiWN layer may be located adjacent, for example vertically adjacent, to the metallization layer 108. Additionally or alternatively, the TiW layer or the TiWN layer may be in contact with the contact layer 104. In other words, the TiW layer or the TiWN layer may be located adjacent, for example vertically adjacent, to the contact layer 104.

Figure 2:
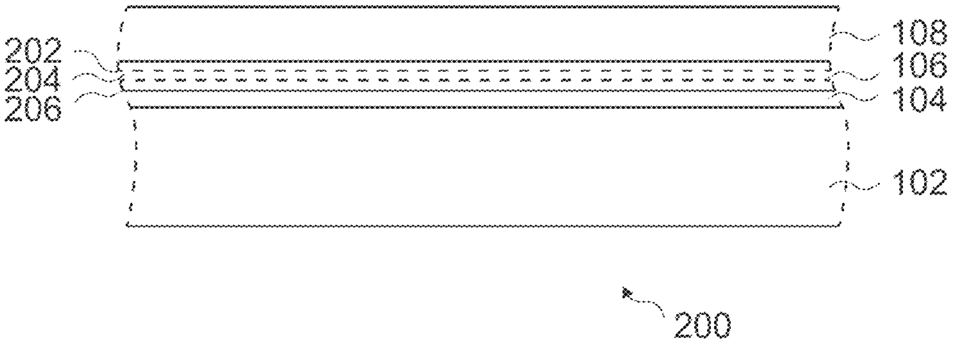
FIG. 2 shows a further schematic cross section of a part of a silicon carbide device comprising a barrier layer structure with a plurality of barrier layers according to an embodiment.

Alternatively, as shown in FIG. 2, the barrier layer structure 106 may comprise a barrier layer stack. The barrier layer structure 106 (or barrier layer stack) may comprise a plurality of barrier layers. For example, the barrier layer structure 106 may comprise one or more layers of the group of a Ti/TiN (titanium-titanium nitride) layer, a TiW layer, a TiWN layer and a MoN (molybdenum nitride) layer.

For example, the barrier layer structure 106 (e.g. the barrier layer stack) may comprise a TiW layer. A TiW layer may provide a diffusion barrier between the metallization layer 108 and the silicon carbide substrate 102. Additionally or alternatively, the barrier layer structure 106 (and/or the barrier layer stack) may comprise a TiWN layer. For example, the TiWN may be formed using sputtering. Within the TiWN layer, the chemical elements Ti, W and N may be distributed homogeneously. That is to say, the chemical composition, in particular the atomic ratios of the chemical elements, of the TiWN layer may vary at most ±5% along the vertical direction and/or the lateral directions. It is, however, also possible that the chemical composition, in particular the atomic ratios of the chemical elements, of the TiWN layer varies at least along the vertical direction. For example, the TiWN layer may be formed from a part of a TiW layer of the barrier layer structure. For example, the nitrogen of the TiWN layer may be distributed inhomogeneously (i.e. not homogeneously) along the vertical direction of the TiWN layer. The TiWN layer may provide a stabilization of the barrier layer structure 106. The barrier layer structure 106 may comprise a TiW layer and a TiWN layer. For example, the TiW layer may be located vertically closer to the silicon carbide substrate 102 than the TiWN layer. For example, the TiWN layer may be in (direct) contact with the metallization layer 108. In other words, the TiWN layer may be located adjacent, for example vertically adjacent, to the metallization layer 108. The TiW layer may be in (direct) contact with the contact layer 104. In other words, the TiW layer may be located adjacent, for example vertically adjacent, to the contact layer.

For example, the barrier layer structure 106 (e.g. the barrier layer stack) may comprise a first TiW layer, a second TiW layer and a TiWN layer. The TiWN layer may be located, for example vertically located, between the first TiW layer and the second TiW layer. For example, the first TiW layer may be located vertically closer to the silicon carbide substrate 102 than the second TiW layer. The second TiW layer may be in contact with the metallization layer 108. In other words, the second TiW layer may be located adjacent, for example vertically adjacent, to the metallization layer. A barrier layer comprising two TiW layers and a TiWN layer may provide a good diffusion barrier and a good adhesion. For example, the barrier layer structure may comprise or consist of a Ti/TiN layer, a first TiW layer, a second TiW layer and a TiWN layer. The TiWN layer may be located, for example vertically located, between the first TiW layer and the second TiW layer. For example, the first TiW layer may be in contact with the Ti/TiN layer. In other words, the first TiW layer may be located adjacent, for example vertically adjacent, to the Ti/TiN layer. The second TiW layer may be in contact with the metallization layer 108. In other words, the second TiW layer may be located adjacent, for example vertically adjacent, to the metallization layer.

For example, the barrier layer structure 106 (e.g. the barrier layer stack) may comprise a Ti/TiN layer (i.e. a Ti/TiN layer structure). For example, the Ti/TiN layer may comprise a titanium (Ti) layer and a titanium nitride (TiN) layer. The titanium layer may be in contact with the titanium nitride layer. The titanium layer may be in contact with the contact layer 104. The titanium layer may be located vertically closer to the semiconductor substrate 102 than the titanium nitride layer. The titanium nitride layer may be located on the titanium layer. The Ti/TiN layer may provide a hydrogen barrier. For example, the Ti/TiN layer may be in (direct) contact with the contact layer 104. In other words, the Ti/TiN layer may be located adjacent, for example vertically adjacent, to the contact layer 104. For example, the barrier layer structure 106 may comprise the Ti/TiN layer and at least one of a TiW layer and a TiWN layer. For example, a barrier layer stack of the barrier layer structure 106 may comprise a Ti/TiN layer and a TiW layer, wherein the Ti/TiN layer is in contact with the contact layer 104. For example, the barrier layer stack of the barrier layer structure 106 may comprise a Ti/TiN layer, a TiW layer, and a TiWN layer (in this order), wherein Ti/TiN is in contact with the contact layer 104. For example, the metal layer stack may comprise or consist of a NiAl layer (e.g. the contact layer 104)-a Ti/TiN layer—a TiW layer—an optional TiWN layer-a Cu (e.g. metallization layer 108). The Ti/TiN layer, the TiW layer and the optional TiWN layer may form the barrier layer structure 106.

For example, the barrier layer structure 106 may comprise or consist of a Ti/TiN layer and a TiW layer. The TiW layer may be formed (e.g. deposited) on the Ti/TiN layer.

Alternatively, the barrier layer structure may comprise or consist of a Ti/TiN layer and a TiWN layer. The TiWN layer may be formed using reactive sputtering.

For example, a vertical thickness of the barrier layer structure 106 may be at least 50 nm (or at least 80 nm, at last 100 nm, at least 150 nm, at least 200 nm, at least 250 nm, at least 350 nm) and/or at most 1000 nm (or at most 800, at most 600 nm, at most 400 nm). If the barrier layer structure comprises a Ti/TiN layer, a vertical thickness of the barrier structure 106 excluding the Ti/TiN layer may be at least 50 nm (or at least 80 nm, at least 100 nm, at least 150 nm, at least 200 nm, at least 250 nm, at least 350 nm) and/or at most 600 nm (or at most 500, at most 400 nm).

The silicon carbide device 100 may comprise a contact layer 104 comprising nickel, silicon and aluminum. For example, the contact layer 104 may be a NiSiAl layer. The contact layer may be a nickel silicon aluminum alloy layer. For example, a NiAl layer may be formed on the silicon carbide substrate 102. The NiAl layer may be processed using high temperature processing, and may subsequently form the NiSiAl layer with SiC of the silicon carbide substrate 102. For example, the contact layer 104 may comprise an alloy formed by a part of the silicon carbide substrate and a layer comprising nickel and aluminum. The contact layer may be or may comprise an alloy comprising or consisting of nickel, silicon and aluminum.

For example, the contact layer 104 may comprise at least at least 1% (or at last 2%, at least 3%, at least 5%, at least 8%, at least 10%) and/or at most 30% (or at most 25%, at most 20%, at most 15%, at most 10%) silicon by volume. The contact layer may comprise at least 0.05% (or at least 0.1%, at least 0.2%, at least 0.5%, at least 1%, at least 5%, at least 10%, at least 15%, at least 20%) and/or at most 30% (or at most 25%, at most 20%, at most 15%) of aluminum by volume. The contact layer 104 may comprise at least 1% (or at least 2%, at least 5%) and/or at most 10% (or at most 8%, at most 5%) carbon inclusions by volume.

For example, the contact layer may be formed by depositing at least 20 nm (or at least 30 nm, at least 40 nm, at least 50 nm, at least 80 nm, at least 100 nm) and/or at most 150 nm (or at most 120 nm, at most 100 nm, at most 80 nm, at most 50 nm) of NiAl on the silicon carbide substrate 102 and performing a high temperature treatment.

The contact layer may comprise a vertical thickness of at least 20 nm (or at least 30 nm, at least 40 nm, at least 50 nm, at least 80 nm, at least 100 nm) and/or at most 150 nm (or at most 120 nm, at most 100 nm, at most 80 nm, at most 50 nm). The contact layer 104 may be located on the silicon carbide substrate 102. For example, the contact layer 104 may be located on a front side surface of the silicon carbide substrate 102. The contact layer 104 may be in (direct) contact with the silicon carbide substrate 102. For example, the contact layer 104 may be in (direct) contact with the barrier layer structure 106.

For example, the contact layer 104 may be an ohmic contact layer. For example, the contact layer 104 may form an ohmic connection (i.e. an electrically conductive connection) to the silicon carbide substrate 102. For example, the silicon carbide device 100 may comprise an ohmic connection between the metallization layer 108 and a doping region of the silicon carbide substrate via the barrier layer structure 106 and the contact layer 104. The contact layer 104 may be in ohmic contact with a first doping region of the silicon carbide substrate 102 (e.g. a source region of a transistor) and with a second doping region of the silicon carbide substrate 102 (e.g. a body region of a transistor). The first doping region may comprise a first conductivity type (e.g. p-doped), and the second doping region may comprise a second conductivity type (e.g. n-doped).

The silicon carbide device 100 may comprise a metallization layer 108 comprising copper. Using a copper metallization layer may enable a high current carrying capacity. In combination with copper bondwires, a copper metallization layer 108 may allow for a higher load cycling capability and may improve heat spreading and heat dissipation. For example, the metallization layer 108 may comprise copper as a main material. For example, the metallization layer 108 may comprise at least 60% (or at least 70%, at least 80%, at least 85%, at least 90%, at least 95%, at least 98%, at least 99%) copper by volume. For example, a vertical thickness of the metallization layer may be at least 5 μm (or at least 10 μm, at least 15 μm, at least 20 μm, at least 30 μm, at least 40 μm) and/or at most 100 μm (or at most 80 μm, at most 70 μm, at most 60 μm, at most 50 μm, at most 40 μm, at most 30 μm, at most 20 μm, at most 15 μm, at most 10 μm). The metallization layer 108 may be formed using copper sputtering for a vertical thickness of 5 μm to 10 μm. The metallization layer 108 may be formed using copper electroplating for a vertical thickness of 20 μm to 100 μm.

Alternatively, the metallization layer 108 may be a metal layer comprising a copper-based metal alloy. For example, the metallization layer 108 may comprise aluminum and copper, e.g. an aluminum copper alloy. The metallization layer 108 may be an AlCu layer. For example, the metallization layer 108 may comprise at most 20% (or at most 15%, at most 10%, at most 5%) and/or at least 0.1% (or at least 0.5%, at least 1%, at least 2%, at least 3%, at least 5%) copper by volume.

The metallization layer 108 may be located on the barrier layer structure 106 (e.g. via a direct contact or via a further layer). The metallization layer 108 may be in contact with the barrier layer structure 106, e.g. located adjacent, for example vertically adjacent, to the barrier layer structure. For example, in a top view of the silicon carbide device 100, a lateral surface area of the barrier layer structure 106 may (entirely) cover a lateral surface area of the metallization layer 108.

For example, the silicon carbide device 100 may further comprise a passivation layer (at least partially) located on at least a part of the metallization layer 108.

The metallization layer 108 may form one or more contact pads of the silicon carbide device 100. For example, the one or more contact pads may be at least partially formed by the metallization layer. For example, a metallization layer may be deposited and structured to form one or more contact pads of the silicon carbide device electrically connected to one or more doping regions of the silicon carbide substrate 102. A minimal lateral dimension of a contact pad of the silicon carbide device may be at most 400 μm (or at most 300 μm, at most 250 μm, at most 200 μm, at most 150 μm, at most 100 μm, at most 80 μm, at most 60 μm, at most 50 μm, at most 40 μm, at most 30 μm). For example, the contact pad may be a gate contact pad (i.e. contact pad connected to a gate of a transistor structure of the silicon carbide device) or a sense contact pad (i.e. a contact pad for obtaining a sensory reading of the silicon carbide device) of the silicon carbide device. A lateral surface area of the contact pad may be at most 200 μm by 200 μm (or at most 150 μm by 150 μm, at most 100 μm by 100 μm, at most 80 μm by 80 μm, at most 60 μm by 60 μm, at most 40 μm by 50 μm, at most 30 μm by 30 μm). For example, a contact pad connected to a gate of a transistor structure of the silicon carbide device may comprise lateral dimensions of at most 200 μm by 200 μm (or at most 150 μm by 150 μm, at most 100 μm by 100 μm, at most 80 μm by 80 μm, at most 60 μm by 60 μm). For example, a maximal lateral dimension of the largest source contact pad may be at most 10000 μm (e.g. at most 5000 μm, at most 2000 μm) or at most 1000 μm (e.g. at most 800 μm, at most than 600 μm, at most 500 μm, e.g. most 250 μm) and/or at least 250 μm (or at least 500 μm, at least 1000 μm, at least 2000 μm, at least 5000 μm). For example, the contact pad may be suitable for bonding a bondwire to the contact pad using nailhead bonding.

For example, the silicon carbide device may comprise a interconnect structure, for example a copper interconnect structure. The interconnect structure may be in contact with the metallization layer. For example, the interconnect structure may be electrically connected to the metallization layer. For example, the interconnect structure may comprise a bondwire, e.g. a copper bondwire.

For example, the silicon carbide device may comprise a bondwire (e.g. one or more bondwires) bonded to the metallization layer 108. For example, the bondwire may be bonded to one of the one or more contact pads of the metallization layer 108. The bondwire may be bonded to the metallization layer 108 using one of ribbon bonding, wedge bonding and nailhead bonding. For example, the bondwire may be further connected to a package structure (e.g. a DCB (Direct Copper Bonded), AMB (Active Metal Braze) or a lead frame) of the silicon carbide device. For example, the bondwire may be copper bondwires. For example, the bondwire may comprise copper as a main material. For example, the bondwire may comprise at least 60% (or at least 70%, at least 80%, at least 85%, at least 90%, at least 95%, at least 98%, at least 99%) copper by volume. Using copper bondwires on a metallization layer comprising copper may provide a stable interconnect with an improved load cycling capability, improved heat spreading and heat dissipation. This may enable a higher robustness against short circuits and a higher maximal current flow. Alternatively or additionally, one or more contact pads may be contacted by a copper clip attach mechanism, e.g. a spacer, for example a copper spacer or a molybdenum spacer. Alternatively, the bondwire may be silver (chemical symbol: Ag) bondwires. For example, the bondwire may comprise silver as a main material. For example, the bondwire may comprise at least 60% (or at least 70%, at least 80%, at least 85%, at least 90%, at least 95%, at least 98%, at least 99%) silver by volume. Alternatively, the bondwire may be gold (chemical symbol: Au) bondwires. For example, the bondwire may comprise gold as a main material. For example, the bondwire may comprise at least 60% (or at least 70%, at least 80%, at least 85%, at least 90%, at least 95%, at least 98%, at least 99%) gold by volume.

For example, the bondwire may have a diameter of at most 150 μm (or at most 120 μm, or at most 100 μm, or at most 80 μm, or at most 60 μm, or at most 40 μm, at most 20 μm). For example, the bondwire may have a diameter of at least 20 μm (or at least 30 μm, or at least 40 μm). For example, the bondwire may have a diameter of 75 μm or 50 μm. The bondwire may be a thin wire bondwire. Bondwires with a reduced diameter, which may be feasible using copper as a main material of the bondwires, may enable contact pads with a reduced lateral surface area, which may lead to silicon carbide devices with a reduced footprint. The bondwire may be bonded to the metallization layer 108 using nailhead (i.e. thermosonic-ball-wedge) bonding. The nailhead of the nailhead bonding may have a size of 2 times to 4 times, for example 3 times, the diameter of the bondwire. Alternatively, the bondwire may be bonded to the metallization layer 108 using wedge bonding or ribbon bonding. The bondwire may be a thick wire bondwire. For example, the bondwire may have a diameter of at least 100 μm (or at least 150 μm, or at least 200 μm, at least 300 μm, at least 400 μm, at least 500 μm, at least 750 μm, at least 1000 μm). For example, bondwires bonded to a source contact pad of the silicon carbide device may be implemented similar (e.g. may comprise a similar or the same diameter) to bond wires bonded to a gate contact pad or to a sense contact pad of the silicon carbide device. For example, a plurality of bondwires may be bonded to a contact pad of the silicon carbide device, e.g. or at least 2 bondwires, at least 5 bondwires, at least 10 bondwires, at least 15 bondwires, at least 20 bondwires, at least 50 bondwires, at least 100 bondwires, at least 200 bondwires, or at least 500 bondwires.

For example, a size of an overall lateral surface of the silicon carbide substrate 102 may be at most 200 $mm^2$ (e.g. at most 150 $mm^2$, at most 100 $mm^2$, at most 50 $mm^2$), at most 20 $mm^2$ (e.g. at most 10 $mm^2$, at most 5 $mm^2$, at most 1.5 $mm^2$), or at most 1 $mm^2$ (e.g. at most 0.8 $mm^2$, at most 0.6 $mm^2$, at most 0.5 $mm^2$, at most 0.4 $mm^2$, at most 0.3 $mm^2$). For example, a size of the overall lateral surface of the silicon carbide substrate may be at least 0.3 $mm^2$ (or at least 0.5 $mm^2$, at least 0.8 $mm^2$, at least 1 $mm^2$, at least 2 $mm^2$, at least 5 $mm^2$) or at least 10 $mm^2$ (e.g. at least 50 $mm^2$, at least 100 $mm^2$, at least 200 $mm^2$, at least 500 $mm^2$). A small overall lateral surface of the silicon carbide substrate 102 may enable a high yield at a constant defect density.

For example, the silicon carbide device may comprise a package structure, e.g. a transistor outline (TO) package, a surface mounted device (SMD) package, a molded power module, an intelligent power module, a power module. For example, the package structure may be based on chip embedding (e.g. embedded on a PCB (Printed Circuit Board) or embedded on a wafer level).

The silicon carbide substrate 102 may be a semiconductor substrate based on silicon carbide semiconductor material. The silicon carbide substrate 102 may, for example, be a silicon carbide die. The silicon carbide substrate 102 may comprise at least one of a silicon carbide wafer and an epitaxially grown silicon carbide body. For example, during manufacturing, a silicon carbide body may be epitaxially grown on a silicon carbide wafer and at least part of the silicon carbide wafer may be removed after epitaxial growth, e.g. with a split-off process.

The silicon carbide device 100 may comprise a transistor structure and/or a diode structure. For example, the silicon carbide device 100 may be or comprise a silicon carbide Metal-Oxide-Semiconductor Field-Effect Transistor. The transistor structure may be an Insulated-Gate Bipolar Transistor (IGBT) or a Field Effect Transistor (FET), for example. The transistor structure may be a vertical transistor arrangement, for example. The transistor structure may be a vertical MOSFET (Metal-Oxide-Semiconductor-FET) or IGBT. For example, the vertical transistor arrangement may be an electrical structure enabling a vertical current flow. For example, the transistor structure of the silicon carbide device 100 may control and/or conduct and/or block a current flow between the front side of the silicon carbide device and a backside of the silicon carbide device.

Figure 3A:
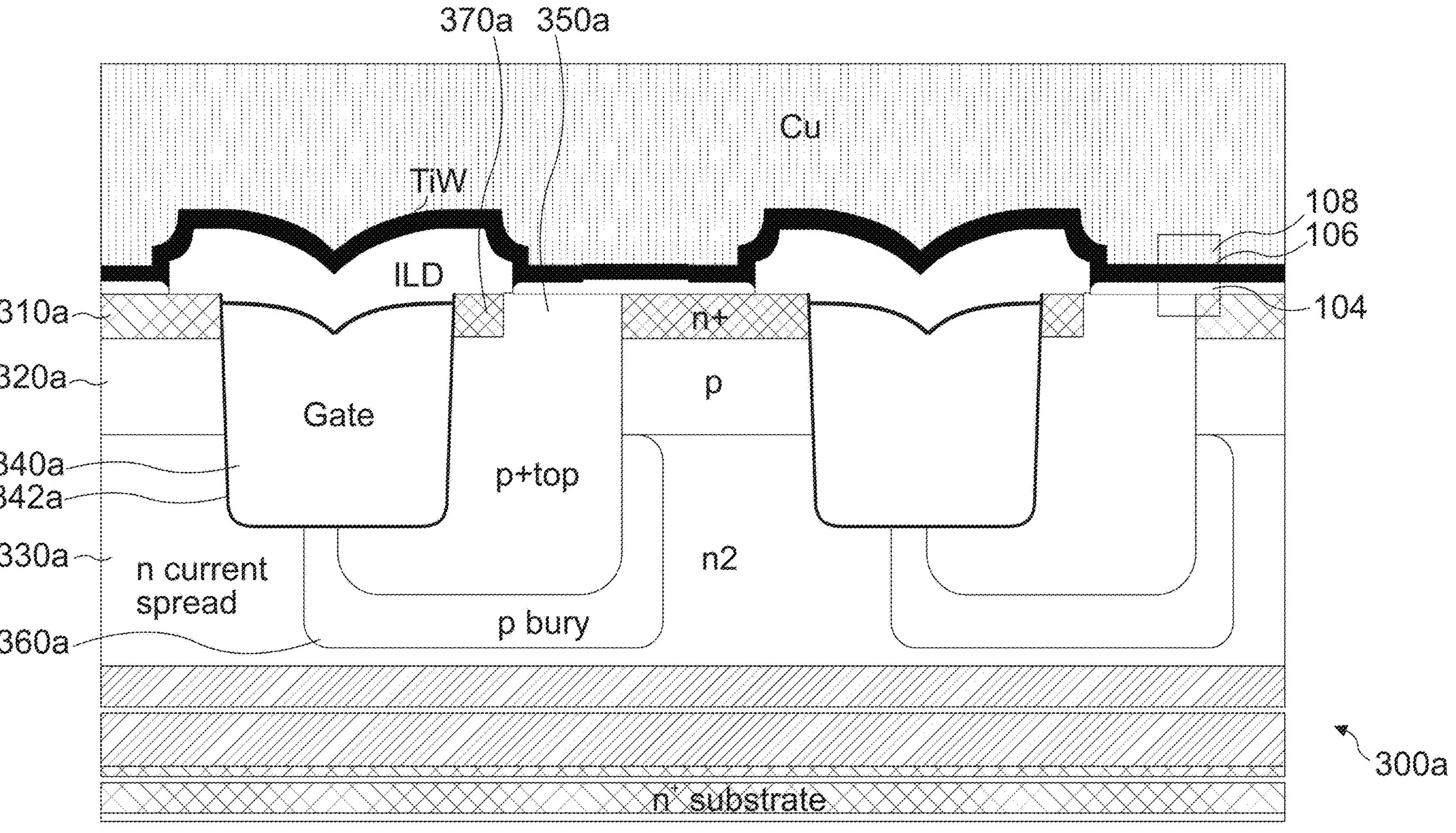
FIGS. 3*a* and 3*b* show schematic cross sections of embodiments of silicon carbide metal oxide semiconductor field effect transistors.

For example, the transistor of the silicon carbide device may comprise a trench gate. The trench gate may comprise a gate electrode and a gate insulation layer, which are both located in a trench. The trench may extend from a front side surface of the silicon carbide substrate into the silicon carbide substrate. For example, a transistor (e.g. transistor cell) may be arranged at only one side of the trench gate (e.g. as shown in FIGS. 3*a* and/or 3*b*; also called asymmetric transistor cell arrangement in the following) or on two sides of the trench gate so that a body region may be located at two opposite sides of the trench gate (also called symmetric transistor cell arrangement in the following). For example, body region may be in contact with a sidewall of the trench gate, e.g. the gate insulation layer of the trench gate. In the case of a symmetric transistor cell arrangement, each body region may be in contact with a respective sidewall of the trench gate.

The semiconductor device may comprise a shielding doping region. The shielding doping region may have the second conductivity type. The shielding doping region may be located below the trench that comprises the trench gate. For example, the shielding doping region may be located adjacent to a bottom of the trench and/or directly below the trench. In addition or as an alternative, the shielding doping region may be located between neighboring gate trenches of neighboring transistor cells. Neighboring shielding doping regions of neighboring transistor cells may form a JFET for shielding the gate insulation layer, in particular a corner of the gate insulation layer between a sidewall and a bottom of the trench, from high electric fields, which could result in destruction of the gate insulation layer.

The shielding doping region may be connected to a different voltage than the gate electrode. In particular, the shielding doping region may be electrically connected with the source region and the body region. The shielding doping region may be located only below or under the trench. In this case, the trench may comprise a second electrode in addition to the gate electrode, which second electrode electrically contacts the shielding doping region. The second electrode may be located, for example, at a bottom of the trench or may be laterally surrounded by the gate electrode. Alternatively, the second electrode may be located outside the trench, e.g. between neighboring gate trenches of neighboring transistor cells. The second electrode may electrically connect the shielding doping region to said different voltage than the gate electrode (e.g., the source voltage). Alternatively, particularly in the case of an asymmetric transistor cell arrangement, an upper portion of the shielding doping region may extend along the sidewall of the trench gate that is opposite to the sidewall that is in contact with the body region. The upper portion may be in contact with and/or electrically connected to the body region and/or the source region. The upper portion of the shielding doping region may have a higher doping concentration than a lower portion of the shielding doping region that is located near the bottom of the trench.

The transistor structure of the silicon carbide device 100 may be a transistor cell of a plurality of transistor cells of a transistor arrangement. A transistor cell may comprise one or more source regions (e.g. distributed or located along a gate), at least one body region and a gate (e.g. a trench gate located within a trench extending into the semiconductor substrate), for example. Further, the transistor cells of the plurality of transistor cells may share a common (mutual) drift region and/or a common drain region (e.g. the transistor cells are MOSFET cells) or a common collector region (e.g. the transistor cells are IGBT cells).

The silicon carbide substrate may comprise a cell region (or active region) laterally surrounded by an edge termination region. The cell region may be a region of the silicon carbide substrate used to conduct more than 90% of a current through the semiconductor substrate in an on-state or conducting state of a transistor arrangement comprising a plurality of transistor cells. For example, the cell region may be an area containing all source regions of the transistor arrangement and/or of all transistors and/or all vertical transistor of the semiconductor device. The edge termination region may be located between an edge of the silicon carbide substrate and the cell region in order to support or block or reduce or dissipate a maximal voltage applied between the front side surface of the semiconductor substrate and a back side surface of the semiconductor substrate within the cell region laterally towards the edge of the silicon carbide substrate.

The transistor structure and/or diode structure of the silicon carbide device 100 may have a breakdown voltage of more than 100V, e.g. more than 200V, more than 500V, more than 1000V, for example. The silicon carbide device 100 may be a power silicon carbide device. A power silicon carbide device, the electrical element arrangement and/or the transistor structure of the power silicon carbide device may have a breakdown voltage or blocking voltage of more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

For example, a vertical direction and a vertical dimension or thicknesses of layers may be measured orthogonal to a front side surface of the silicon carbide substrate 102, along the vertical direction of the silicon carbide substrate 102, and a lateral direction and lateral dimensions may be measured in parallel to the front side surface of the silicon carbide substrate 102, along the lateral directions of the silicon carbide substrate 102. The front side of the silicon carbide substrate may be the side used to implement more sophisticated and complex structures (e.g. gates of transistors or transistor cells) than at the back side of the silicon carbide substrate, since the process parameters (e.g. temperature) and the handling may be limited for the back side, if structures are already formed at one side of the silicon carbide substrate, for example. A layer stack of the silicon carbide device 100 comprising the contact layer 102, the barrier layer structure 106 and the metallization layer 108 may be located at the front side of the silicon carbide substrate 102.

More details and aspects of the silicon carbide device 100 are mentioned in connection with the proposed concept or one or more examples described above or below (e.g. FIG. 2 to 14). The silicon carbide device 100 may comprise one or more additional optional features corresponding to one or more aspects of the proposed concept or one or more examples described above or below.

FIG. 2 shows a schematic cross section of a part of a silicon carbide device 200. The silicon carbide device 200 may be a power semiconductor device, for example. The silicon carbide device 200 may be implemented similar to the silicon carbide device 100 of FIG. 1. The silicon carbide device 200 may comprise a silicon carbide substrate 102. The silicon carbide device 200 may further comprise a contact layer 104 comprising nickel, silicon and aluminum. The contact layer 104 may be located on the silicon carbide substrate 102. The silicon carbide device 200 may comprise a barrier layer structure 106 (and/or an adhesion promoting layer) comprising titanium and tungsten. The contact layer 104 may be located, for example vertically located, between the silicon carbide substrate 102 and at least a part of the barrier layer structure 106. The silicon carbide device 200 may comprise a metallization layer 108 (and/or a power metal) comprising copper. The barrier layer structure 106 may be located, for example vertically located, between the silicon carbide substrate 102 and the metallization layer 108. The barrier layer structure 106 of the silicon carbide device 200 may comprise a plurality of barrier layers 202, 204 and 206.

More details and aspects of the silicon carbide device 200 are mentioned in connection with the proposed concept or one or more examples described above or below (e.g. FIG. 1, FIG. 3*a* to 14). The silicon carbide device 200 may comprise one or more additional optional features corresponding to one or more aspects of the proposed concept or one or more examples described above or below.

Embodiments may further relate to a further silicon carbide device. The further silicon carbide device may be implemented similar to the silicon carbide device introduced in connection with FIG. 1 or 2. Instead of the barrier layer structure 106 comprising titanium and tungsten, the further silicon carbide device may comprise a barrier layer structure comprising molybdenum and nitrogen, e.g. a MoN layer. The further silicon carbide device may comprise a silicon carbide substrate, which may be implemented similar to the silicon carbide substrate 102 introduced in connection with FIGS. 1 and/or 2. The silicon carbide device may comprise a contact layer comprising nickel, silicon and aluminum, which may be implemented similar to the contact layer 104 introduced in connection with FIGS. 1 and/or 2. The contact layer may be located on the silicon carbide substrate. The further silicon carbide device may comprise a barrier layer structure comprising molybdenum and nitrogen. The contact layer may be located between, for example located vertically between, the silicon carbide substrate and at least a part of the barrier layer structure. The silicon carbide device may comprise a metallization layer comprising copper, which may be implemented similar to the metallization layer 108 introduced in connection with FIG. 1 or 2. The barrier layer structure may be located between, for example located vertically between, the silicon carbide substrate and the metallization layer.

In at least some embodiments, the barrier layer structure of the further silicon carbide device may be implemented similar to the barrier layer structure 106 introduced in connection with FIGS. 1 and/or 2, wherein the barrier layer structure might not necessarily comprise titanium and tungsten. For example, the barrier layer structure may be implemented like the barrier layer structure 106 of FIGS. 1 and/or 2, wherein instead of a TiW layer a MoN layer is used. For example, the barrier layer structure may comprise a Ti/TiN layer. For example, the barrier layer structure may comprise a Ti/TiN layer and a MoN layer. The MoN layer may be in contact with the metallization layer. The Ti/TiN layer may be in contact with the contact layer. The barrier layer structure may comprise a TiWN layer.

The further silicon carbide device may comprise a transistor structure and/or a diode structure. For example, the further silicon carbide device may be or comprise a silicon carbide Metal-Oxide-Semiconductor Field-Effect Transistor. The transistor structure may be an Insulated-Gate Bipolar Transistor (IGBT) or a Field Effect Transistor (FET), for example. The transistor structure may be a vertical transistor arrangement, for example. The transistor structure may be a vertical MOSFET (Metal-Oxide-Semiconductor-FET) or IGBT. For example, the vertical transistor arrangement may be an electrical structure enabling a vertical current flow. For example, the transistor structure of the further silicon carbide device may control and/or conduct and/or block a current flow between the front side of the silicon carbide device and a backside of the silicon carbide device.

More details and aspects of the further silicon carbide device are mentioned in connection with the proposed concept or one or more examples described above or below (e.g. FIG. 1, FIG. 3*a* to 14). The further silicon carbide device may comprise one or more additional optional features corresponding to one or more aspects of the proposed concept or one or more examples described above or below.

Figure 3B:
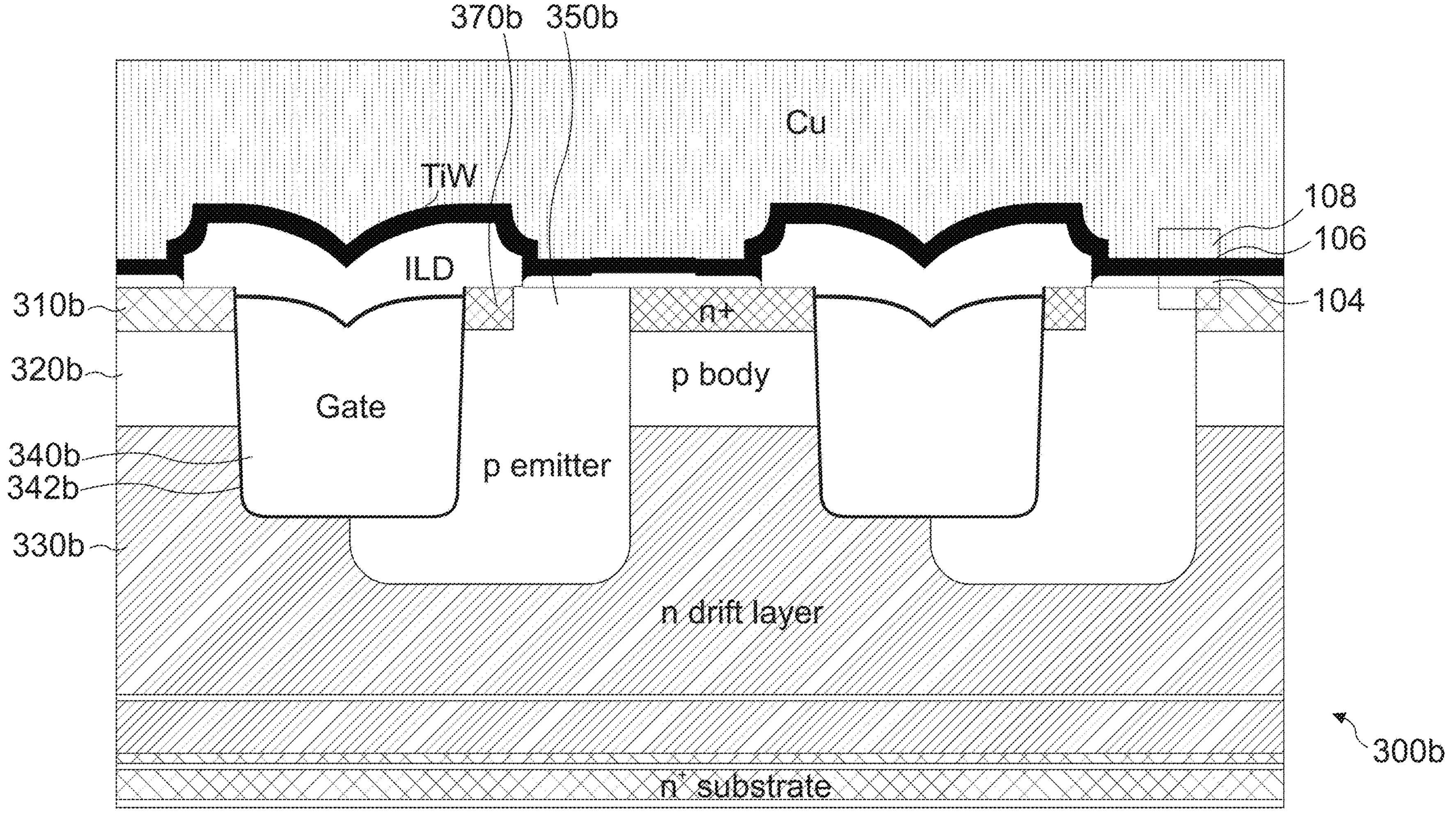

FIGS. 3*a* and 3*b* shows schematic cross sections of silicon carbide devices 300*a*; 300*b*, which may be silicon carbide metal oxide semiconductor field effect transistors. The silicon carbide devices 300*a*; 300*b* may be implemented similar to the silicon carbide devices 100; 200 as introduced in connection with FIGS. 1 and 2. The silicon carbide devices 300*a*; 300*b* comprise a contact layer 104, a (TiW) barrier layer structure 106 and a metallization layer 108. The contact layer 104, the barrier layer structure 106 and/or the metallization layer 108 may be implemented similar to the respective components of the silicon carbide devices 100; 200. The silicon carbide devices 300*a*; 300*b* comprise a transistor comprising a body region 320*a*; 320*b* located vertically between a highly n-doped n+ source region 310*a*; 310*b* and a lightly n-doped drift region 330*b* (silicon carbide device 300*b* of FIG. 3*b*) and/or a current spread region n2 330*a* (FIG. 3*a*).

The silicon carbide devices 300*a*; 300*b* comprise a trench gate structure. For example, a gate insulation layer 342*a*; 342*b* of the gate structure is located between the body region 320*a*; 320*b* and a gate electrode 340*a*; 340*b* located in the trench. In an operating mode of the transistor, a current flow through a channel region of the transistor may be controlled by a gate voltage applied to the gate electrode 340*a*: 340*b*.

A (highly) p-doped region 350*a*; 350*b* (p+ top/p emitter) of the silicon carbide devices 300*a*; 300*b* may be located adjacent to the gate insulation layer 342*a*; 342*b* at a side of the gate structure opposite to the side wall of the gate structure located adjacent to the body region of the transistor. The highly p-doped region 350*a*; 350*b* extends from the bottom of the trench gate structure along the side wall of the trench gate structure to a highly n-doped region 370*a*: 370*b*. Further, in FIG. 3*a*, a p-doped shielding region 360*a* (p bury) may be located at the bottom of the trench structure. The highly n-doped region 370*a*; 370*b* extends along the side wall of the trench gate from within the highly p-doped region 350*a*; 350*b* to the front side surface of the silicon carbide substrate. The highly n-doped region 370*a*; 370*b* may be formed simultaneously with the highly n-doped n+ source region 310*a*: 310*b*. The highly n-doped region 370*a*; 370*b* may be connected to the highly n-doped n+ source region 310*a*, 310*b*. For example, an highly n-doped interconnecting region may be positioned between the highly n-doped n+ source region 310*a*; 310*b* and the highly n-doped region 370*a*; 370*b* (not shown in the cross sections of FIGS. 3*a* and 3*b*). The highly n-doped region 370*a*; 370*b* and/or the highly n-doped source region 310; 310*b* may extend along the trench in a lateral direction, in particular a lateral direction perpendicular to the cross-section shown in FIGS. 3*a* and 3*b*.

More details and aspects of the silicon carbide devices 300*a*; 300*b* are mentioned in connection with the proposed concept or one or more examples described above or below (e.g. FIG. 1, 2, 4*a* to 14). The silicon carbide devices 300*a*; 300*b* may comprise one or more additional optional features corresponding to one or more aspects of the proposed concept or one or more examples described above or below.

Figure 4A:
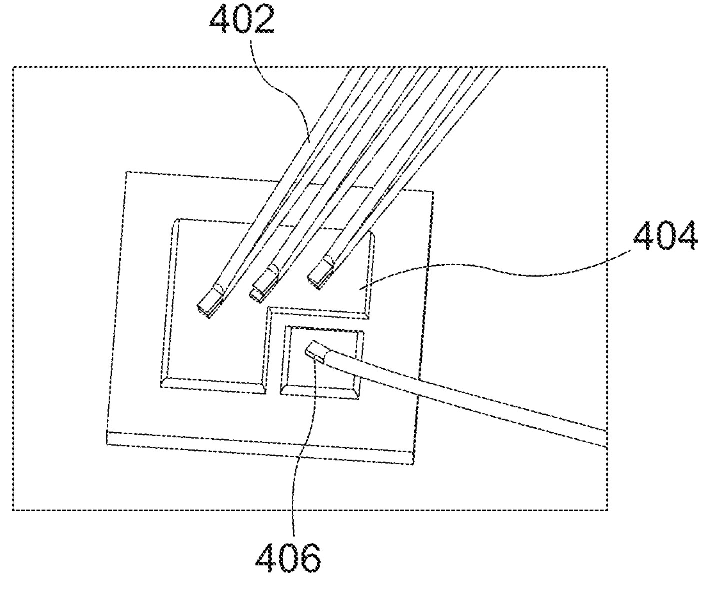
FIGS. 4*a* and 4*b* show schematic diagrams of bond wires bonded to contact pads of silicon carbide devices according to embodiments.
Figure 4B:
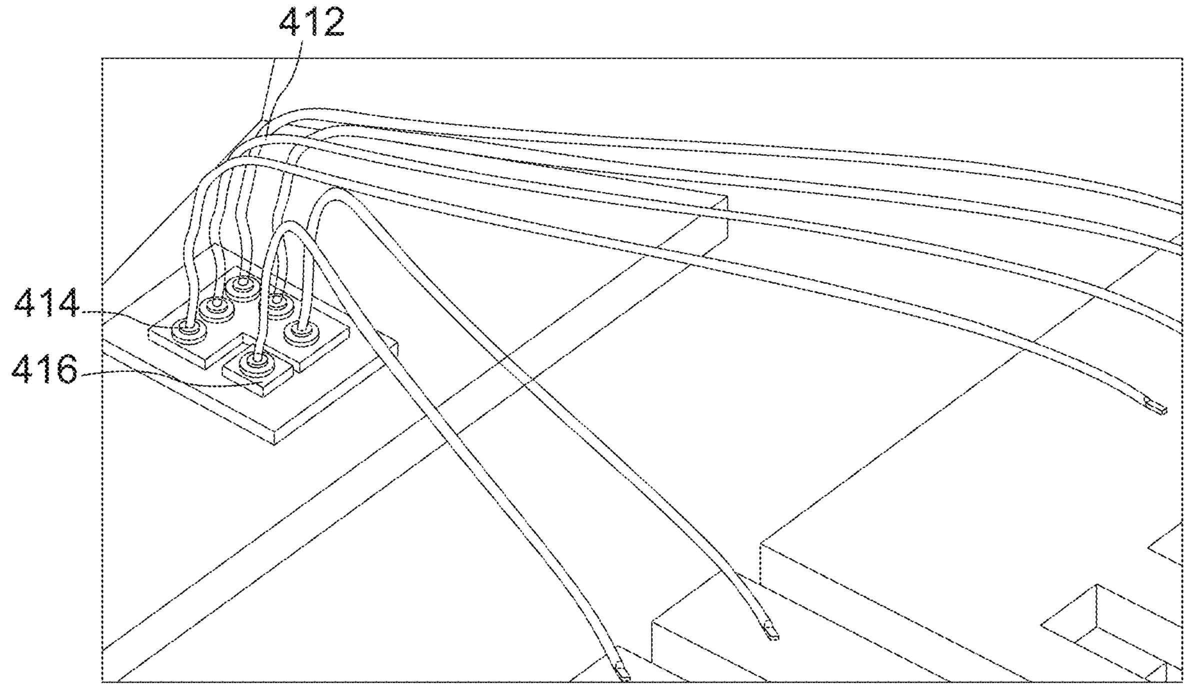

FIGS. 4*a* and 4*b* show schematic diagrams of bond wires bonded to contact pads of silicon carbide devices. FIG. 4*a* shows an embodiment of a silicon carbide device comprising contact pads 404 (source) and 406 (gate). The contact pads 404 and 406 may be at least partially formed by a metallization layer of the silicon carbide device. FIG. 4*a* further shows bondwires 402, which are bonded to the contact pads using wedge bonding. On contact pad 404, double wedge bonds are used, on contact pad 406, a (single) wedge bond is used. FIG. 4*b* shows another embodiment of a silicon carbide device comprising contact pads 414 (source) and 416 (gate). The contact pads 414 and 416 may be at least partially formed by a metallization layer of the silicon carbide device. FIG. 4*b* further shows bondwires 412, which are bonded to the contact pads using nailhead (or thermosonic ball wedge) bonding.

More details and aspects of the silicon carbide devices are mentioned in connection with the proposed concept or one or more examples described above or below (e.g. FIGS. 1 to 3*b*, 5 to 14). The silicon carbide devices may comprise one or more additional optional features corresponding to one or more aspects of the proposed concept or one or more examples described above or below.

Some embodiments relate to semiconductor devices with a layer stack as described with respect to FIG. 1. In these examples, the layer stack may be provided on a silicon substrate or another wide band gap semiconductor substrate instead of silicon carbide. For example, a wide band gap semiconductor substrate may have a band gap larger than 2.5 eV, for example larger than 3 eV. For example, the wide band gap semiconductor substrate may be a diamond (C) substrate or a gallium nitride (GaN)-based semiconductor substrate.

Figure 5:
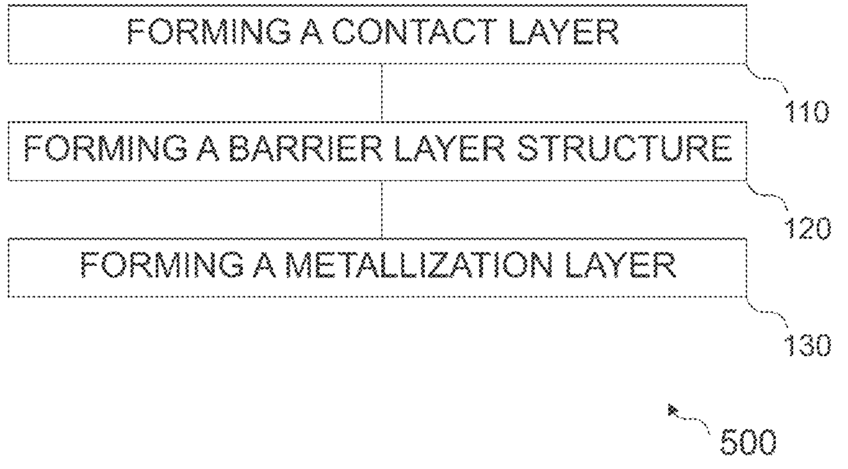
FIG. 5 shows a flow chart of a method for forming a silicon carbide device according to an embodiment.

FIG. 5 shows a flow chart of a method 500 for forming a silicon carbide device. Alternatively, a power semiconductor device may be formed according to the method 500, for example. The silicon carbide device may be implemented similar to the silicon carbide devices introduced in connection with FIGS. 1 to 4*b*. The method 500 may comprise forming 110 a contact layer 104 comprising nickel, silicon and aluminum on a silicon carbide substrate 102 of the silicon carbide device. The method 500 may comprise forming 120 a barrier layer structure 106 comprising titanium and tungsten after forming the contact layer 104. Alternatively or additionally to forming the barrier layer structure 106, an adhesion promoting layer may be formed, for example. The method 500 may comprise forming 130 a metallization layer 108 comprising copper after forming the barrier layer structure 106. Alternatively or additionally to forming the metallization layer 108, a power metal may be formed, for example. An ohmic connection (e.g. an ohmic path) may be formed between the metallization layer and a doping region of the silicon carbide substrate (e.g. a source region of the silicon carbide substrate or a body region of the silicon carbide substrate) via the (i.e. through the) barrier layer structure 106 and the contact layer 104.

The contact layer 104 may be located, for example vertically located, between the silicon carbide substrate 102 and at least a part of the barrier layer structure 106 (and/or the adhesion promoting layer, for example). The barrier layer structure 106 may be located, for example vertically located, between the silicon carbide substrate 102 and the metallization layer 108 (and/or the power metal, for example).

For example, the forming 110 of the contact layer 104 may comprise depositing a layer comprising NiAl on the silicon carbide substrate 102. For example, the NiAl may be deposited in a single step using a sputtering process. Alternatively, the NiAl may be deposited by depositing Ni and Al layers adjacently. For example, an Al content of the NiAl layer may be at least 0.1% (or at least 0.2%, at least 0.5%, at least 1%, at last 2%, at least 5%, at least 10%, at least 15%) and/or at most 30% (or at most 25%, at most 20%, at most 15%, at most 10%, at most 5%, at most 2%, at most 1%) by volume. The NiAl layer may comprise a vertical thickness of at least 20 nm (or at least 30 nm, at last 40 nm, at least 50 nm, at least 80 nm, at least 100 nm) and/or at most 150 nm (or at most 120 nm, at most 100 nm, at most 80 nm, at most 50 nm). The forming 110 of the contact layer 104 may further comprise high temperature processing the silicon carbide substrate 102 and the NiAl to form a NiSiAl contact layer 104 providing an ohmic connection to the silicon carbide substrate 102. The method may comprise alloying a region of the silicon carbide substrate 102 and a NiAl layer to form the NiSiAl contact layer. For example, the front side surface of the silicon carbide substrate 102 may be cleaned before depositing the layer comprising NiAl. For example, the forming 110 of the contact layer may comprise cleaning the front side surface of the silicon carbide substrate 102. For example, the barrier layer structure 106 may be deposited on the contact layer 104. For example, the method may further comprise cleaning the front side of the silicon carbide device after forming the contact layer (e.g. after forming the ohmic contact), e.g. using wet chemical cleaning or using dry cleaning. For example, the barrier layer structure 106 may be further deposited on parts of the silicon carbide substrate (e.g. see FIG. 6 600*a*). For example, the forming 120 of the barrier layer structure may comprise forming a Ti/TiN layer.

For example, the metallization layer 108 may comprise depositing the (copper) metallization layer, e.g. in situ with the barrier layer structure 106 by using sputtering or subsequently using copper electroplating. The method may further comprise forming a passivation layer on the metallization layer.

More details and aspects of the method 500 are mentioned in connection with the proposed concept or one or more examples described above or below (e.g. FIGS. 1 to 4, 6*a* to 14). The method 500 may comprise one or more additional optional features corresponding to one or more aspects of the proposed concept or one or more examples described above or below.

For example, ultra-small SiC chips may be used. Using conventional connecting technologies on the basis of Al (aluminum) front side metallization and Al wire bonds this might hardly be possible as there may be limitations due to Al wire thickness in order to adhere to bonding rules. Otherwise, to be able to place a corresponding Al wire, unnecessarily more SiC area might have to be provided. Due to the high area-/space-related costs, very small chips may be designed which are in contradiction to the diameter of the Al wire. Further, there may be limitations of static load with respect to Al Cu (aluminum copper) and Al wire. New metallization systems may be required for SiC devices. A further aspect is overload occurrences like short circuits and in particular surge current events, which may occur more frequently in the application. With SiC only a very small top area of the chip (3-10 μm) may be electrically strained. Thus, in particular the front side metallization may become very hot. The low melting point of aluminum may be a hindrance here. A premature ageing (e.g. recrystallization) might take place.

At least some approaches may be based on Si IGBTs (Insulated Gate Bipolar Transistor), as here on the one hand Al(Si)Cu (aluminum silicon copper) metallization including Al wire bond and on the other hand as a further improvement pure Cu front side metallization including Cu wire bonds may be used. In case of the AlCu front side metallization, a diffusion barrier might not be necessarily required, Ti (titanium) or also TiN (titanium nickel) might often be used are a liner (adhesive agent). In case of the Cu front side metallization, a Cu diffusion barrier may be necessary to prevent a diffusion of Cu into Si. Here, TiW/W (titanium wolfram/wolfram) based barriers may be used. Al based metallization systems may be integrated without barrier and may be used in at least some semiconductor devices. However, with these products, increasingly the interconnect (Al(Si)Cu front side metal Al wire) may limit product performance regarding power cycling and short circuit robustness, the latter also based on a weaker heat spreading, the reduced specific thermal capacity and melting temperature of Al. Furthermore, there may be high manufacturing costs to accommodate Al wedge wires on the chip.

As a 5 to 10 times higher power density may be possible with SiC devices due to material reasons, an AlCu—Al bond might not be considered with further shrinks if advantages of the basic material are to be utilized. By using a Cu based front side metallization in context with a Cu wire bonding, this may be possible, however.

At least some embodiments may provide a combined ohmic contact-barrier-copper-front-side-metallization for increasing a power density of silicon carbide MOSFETs. Embodiments may be based on using a combined front side layer set-up for SiC devices. The combined front side layer set-up for SiC devices may consist or comprise of an NiAl contact layer (e.g. the contact layer 104), a TiW diffusion barrier (e.g. the barrier structure 106) and the final Cu metallization (e.g. the metallization layer 108). The difference as compared to Si may be the first NiAl contact layer, which may form the ohmic contact to the semiconductor body. While one Ti(W) layer may be sufficient with high-doped Si to realize a low-ohmic metal-semiconductor tunneling contact, this might not be feasible with SiC due to the substantially greater band gap (3.3 eV instead of 1.1 eV). As a starting material, Ni based metal alloys may be used with an Al content of 0.1% to 30% and thicknesses of 20 to 150 nm. NiAl may be deposited in one step with a sputter process, wherein here an NiAl composite target with a given composition may be used. It may also be possible to deposit the Ni and Al layer next to one another. In this case, the NiAl composition may be freely selected. By means of a subsequent high-temperature step, the NiAl layer forms the ohmic contacts for n-SiC and for p-SiC. Here, mixing of the semiconductor (e.g. the silicon carbide substrate 102) and the metal (e.g. the contact layer 104) may result. Thus, an ohmic contact may be acquired. This process block might be critical as the metal-semiconductor interface may react highly sensibly to metal compositions (for n-SiC the Al content in NiAl might usually be lower, for n-SiC higher), doping and alloying temperature. It may be important that the SiC surface is free from impurities before NiAl is deposited.

In the next step, a TiW based Cu barrier (e.g. the barrier layer structure 106) and the power Cu (e.g. the metallization layer 108) itself may be deposited. The power Cu may be deposited in situ with the TiW barrier (by sputtering technologies) or later on by Cu electroplating. The latter may be manufactured very thick of up to 20-100 μm while with sputtered Cu alone there may be a limitation of approx. 5-10 μm. A passivation/protection layer may serve as a protection of the Cu metallization. Thus, very small SiC chips may be possible, which may comprise lower capacitances and a higher electric yield (with a constant defect density) merely due to their area. The Cu wires may be applied in tried and tested thin wire technology (Cu Nailhead Bonding) or in thick wire technology (Wedge Bonding). Thin Cu wires may provide a maximal flexibility in combination with a high current carrying capacity. The substantially more stable Cu/Cu interconnect may allow for a higher load cycling capability. Further, due to the Cu (Cu & Cu wires) a better heat spreading and heat dissipation may be possible from the SiC front side. Thereby a higher short circuit robustness and a higher current class may be enabled. Instead of Cu wires, the Front Side Interconnect (FSI) may be applied by Galvanic (Embedding) or by Cu clip or Cu block. The Cu thin wire connecting technology may be substantially more space-saving than the Al wedge connecting technology. Thus, the gate pad may be reduced to a dimension of e.g. 60 μm×60 μm. This may reduce costs, e.g. when considering the high space costs for SiC or with further sensing pads (temperature, current, etc.).

In embodiments, the silicon carbide device may comprise an ohmic contact layer, a barrier and a Cu metallization. For example, the silicon carbide device may comprise an ohmic contact layer, a barrier, a Cu metallization and Cu bondwires. For example, the silicon carbide device may comprise a NiAl ohmic contact layer, a barrier, a Cu metallization and Cu bondwires. For example, the silicon carbide device may comprise an ohmic contact layer, a TiW barrier, a Cu metallization and Cu bondwires. For example, the silicon carbide device may comprise a NiAl ohmic contact layer, a TiW barrier, a Cu metallization and Cu bondwires. For example, the silicon carbide device may comprise a nickel-based ohmic contact layer, a barrier, a Cu metallization and Cu bondwires. Alternatively, the silicon carbide device may comprise a titanium-based ohmic contact layer, a barrier, a Cu metallization and Cu bondwires. For example, the silicon carbide device may comprise an ohmic contact layer, a barrier comprising Ti/TiN, a Cu metallization and Cu bondwires. Alternatively or additionally, the silicon carbide device may comprise an ohmic contact layer, a barrier comprising MoN, a Cu metallization and Cu bondwires.

As a basis for at least some embodiments, a SiC diode or also an SiC MOSFET may be used, wherein in the following device-specific details may be omitted. The main elements of the FEOL (Front End of Line) process flow may be illustrated in FIGS. 6*a* to 6*e*, starting with the process block ohmic NiAl contact (FIGS. 6*a* and 6*b*, e.g. the contact layer 104) followed by the TiW barrier (FIG. 6*c*, e.g. the barrier layer structure 106 comprising a single TiW layer) and then the manufacturing of the Cu metallization (FIG. 6*d* sputtering process, e.g. the metallization layer 108). With the device passivation (here: imide 602, FIG. 6*e*) the front side process may be completed, the front end (FE) process may be completed by the back side processes (grinding, back side contact, not illustrated).

FIG. 6*a* to 6*e* show schematic cross sections of a part of silicon carbide devices 600*a*; 600*b* in various stages of forming the silicon carbide device. The silicon carbide devices 600*a*; 600*b* may be implemented similar to the silicon carbide devices introduced in connection with FIGS. 1 to 5. The silicon carbide devices 600*a*; 600*b* comprise a silicon carbide substrate 102, a contact layer 104 comprising NiAl, a barrier layer structure 106 comprising TiW and a metallization layer 108 comprising copper. The silicon carbide substrate 102, the contact layer 104, the barrier layer structure 106 and/or the metallization layer 108 may be implemented similar to the respective components of the silicon carbide introduced in connection with FIGS. 1 to 5. The silicon carbide devices 600*a* and 600*b* may differ in that the barrier layer structure 106 of the silicon carbide device 600*a* covers the (entire) contact layer 104, and the barrier layer structure 106 of the silicon carbide device 600*b* (only) partially covers the contact layer 104.

Figure 6A:
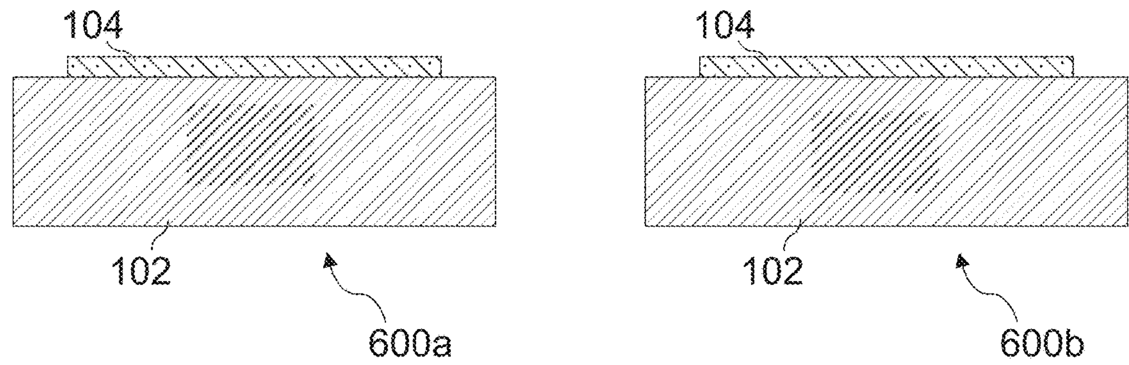
FIG. 6*a* to 6*e* show schematic cross sections of a part of a silicon carbide device according to an embodiment in various stages of forming the silicon carbide device.

FIG. 6*a* shows a schematic cross-section of a SiC semiconductor body (of the silicon carbide devices 600*a*; 600*b* comprising a silicon carbide substrate 102) after deposition and structuring of the ohmic NiAl metallization 104 (e.g. the contact layer 104) for contacting the p- and n-SiC areas (not specified in the Figure).

Figure 6B:
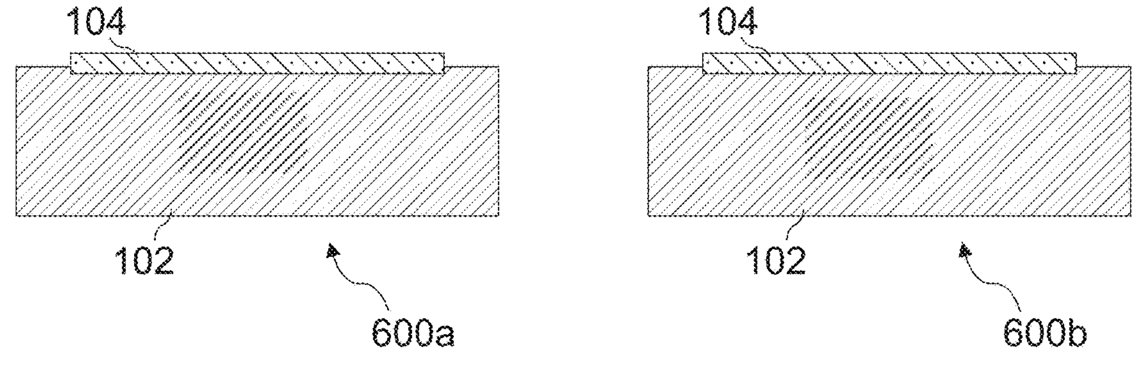

FIG. 6*b* shows a schematic cross-section of a SiC semiconductor body after alloying the NiAl contact 104 by means of RTP (Rapid Thermal Processing).

Figure 6C:
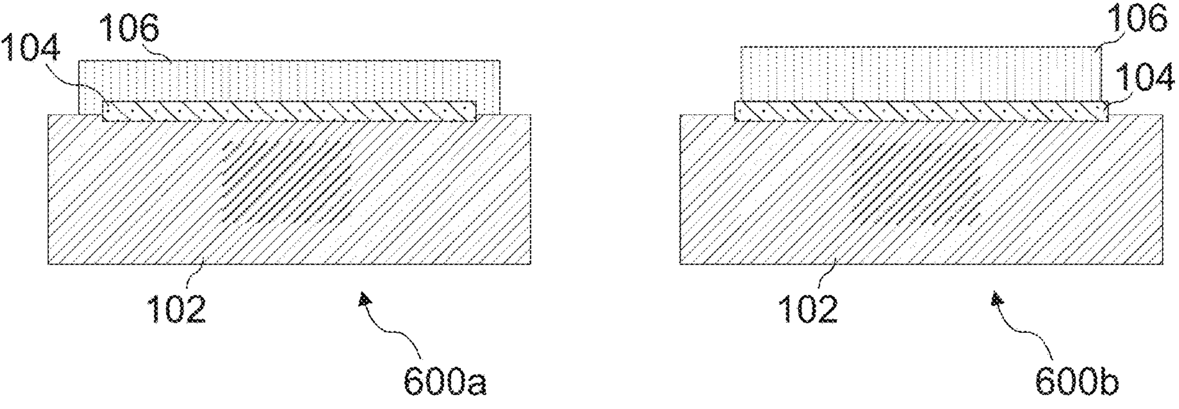

FIG. 6*c* shows a schematic cross-section of a SiC semiconductor body after deposition and structuring of the TiW barrier 106 (or another barrier layer structure 106 and/or an adhesion promoting layer, for example). In silicon carbide device 600*a*, the TiW layer is smaller than the NiAl layer, in silicon carbide device 600*b*, the NiAl contact layer is completely covered by the TiW layer.

Figure 6D:
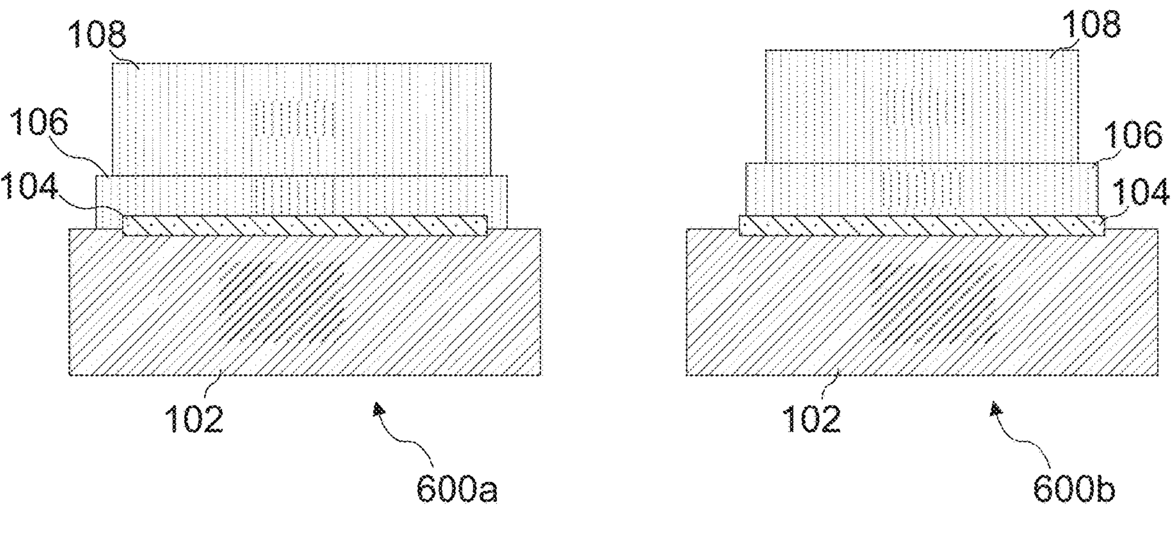

FIG. 6*d* shows a schematic cross-section of a SiC semiconductor body after deposition and structuring of the Cu pad metallization 108 (e.g. the metallization layer 108 and/or the power metal).

Figure 6E:
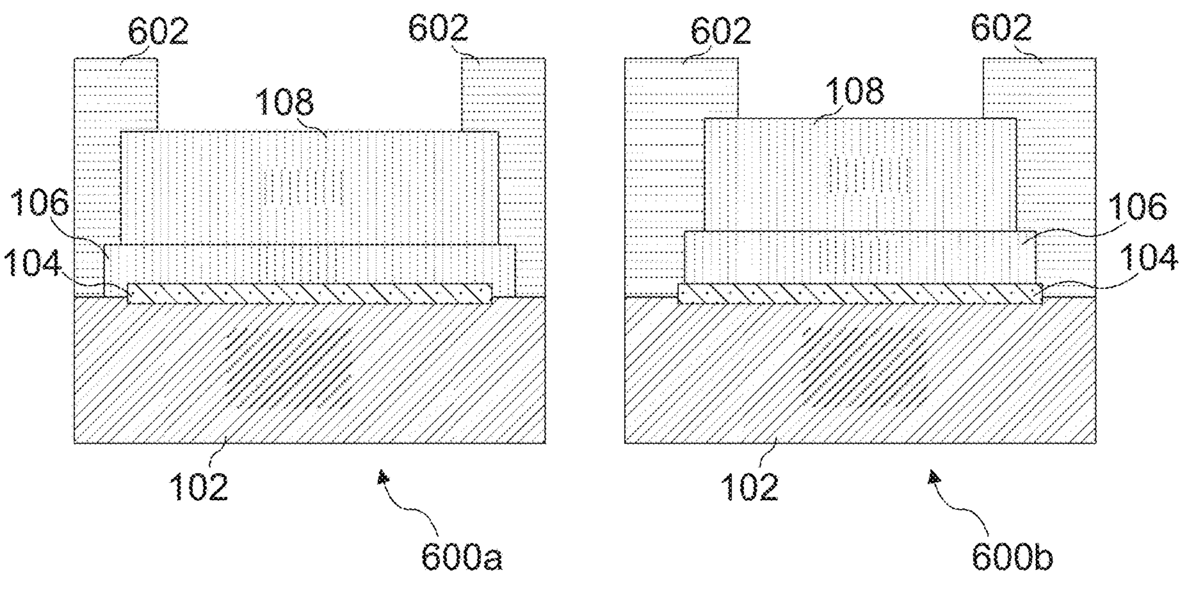

FIG. 6*e* shows a schematic cross-section of a SiC semiconductor body after deposition and structuring of the imide passivation 602.

More details and aspects of the examples shown in FIG. 6*a* to 6*e* are mentioned in connection with the proposed concept or one or more examples described above or below (e.g. FIGS. 1 to 5, 7 to 14). The method 500 may comprise one or more additional optional features corresponding to one or more aspects of the proposed concept or one or more examples described above or below.

Figure 7:
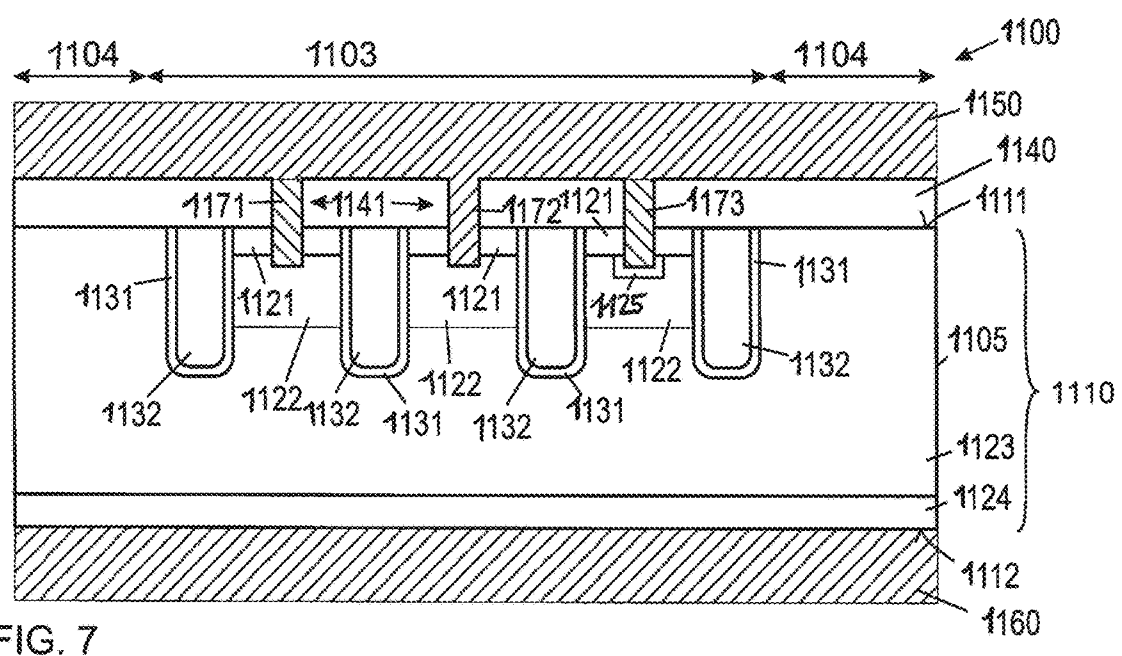
FIG. 7 illustrates a cross-sectional view of a power semiconductor device according to an embodiment.

FIG. 7 illustrates a cross sectional view of a power semiconductor device 1100 having a semiconductor substrate 1110. The power semiconductor device 1100 may comprise a silicon carbide device, for example, and/or the semiconductor substrate 1110 may be a silicon carbide substrate, for example. In the following, the power semiconductor device (e.g. silicon carbide device) is also simply referred to as power device. As a mere example, the power semiconductor device 1100 in FIG. 7 is depicted as a vertical transistor with a trench gate and a so-called trench contact. A person skilled in the art will, however, appreciate that certain concepts explained in connection with the embodiment shown in FIG. 7, as well as the embodiments shown in FIGS. 7 to 11, are applicable to various types of power semiconductor devices, such as, for example, a field-effect transistor (FET; e.g. a MOSFET or a JFET), an IGBT, or a diode (e.g., a merged-pin Schottky diode or a merged-pin heterojunction diode), wherein each of the mentioned power semiconductor devices may optionally comprise a so-called superjunction structure (also called “charge compensation structure). In particular, various concepts explained in connection with the embodiment of FIGS. 7 to 11 may be applicable to a lateral transistor, a transistor with a planar gate contact and/or a transistor with a planar source contact. In addition, various concepts explained in connection with the embodiments of FIGS. 7 to 11 may also be applicable to a transistor (e.g., a MOSFET) with a v-shaped gate (so-called VMOS).

The semiconductor substrate 1110 (e.g. the silicon carbide substrate) can be made of any wide bandgap semiconductor material suitable for manufacturing semiconductor components. Typically, the semiconductor substrate 1110 comprises silicon carbide (SiC) as a main material. In general, the semiconductor substrate 1110 may comprise SiC, GaN, AlN or $Ga_2O_3$, more specifically SiC, GaN or AlN, as a main material. Typically, the semiconductor substrate 1110 is comprised of any of these wide bandgap materials, which contain typical unintentional impurities and intentional dopants. In other words, the main material of the semiconductor substrate may be the respective wide bandgap material, for example SiC (including any crystal variations thereof), GaN, AlN or $Ga_2O_3$ in particular SiC or AlN. Hereinafter, the main material of a layer or a substrate may be those atoms that form the chemical compound or alloy.

Even though wide bandgap materials in general, and specifically SiC, may have a higher intrinsic temperature, the use of a wide bandgap semiconductor material as a substrate material is not to be seen as an essential feature of the power semiconductor device 1100. Instead, the semiconductor substrate 1110 (e.g. the silicon carbide substrate) may comprise any other suitable material for power semiconductor devices, such as, for example, silicon (Si).

According to an embodiment, the semiconductor substrate 1110 is mainly formed of SiC, and particularly of 4H-SiC, i.e. the main material, or a main part, of the semiconductor substrate 1110 has a 4H-SiC crystal structure.

The semiconductor substrate (e.g. silicon carbide substrate) may be a semiconductor wafer and/or an epitaxially grown semiconductor body. For example, the semiconductor substrate may comprise a semiconductor body that has been epitaxially grown onto a semiconductor wafer. Here, at least part of the wafer may have been removed (e.g., by thinning or dicing) after the epitaxial growth.

The semiconductor substrate 1110 (e.g. silicon carbide substrate) comprises a first surface 1111, defining a first side of the power device 1100, and a second surface 1112 being arranged opposite to the first surface 1111 and defining a second side of the power device 1100.

The power device 1100 includes an active region 1103. The active region 1103 is the region of the semiconductor substrate 1110 which mainly carries the load current through the power device 1100. In case of three-terminal devices such as MOSFETs or IGBTs, the active region 1103 is defined by a plurality of active transistor cells each configured for carrying a portion of the load current. In particular, the active region 1103 may comprise at least one channel of an active transistor cell, which at least one channel may be configured for carrying a portion of the load current.

The power device 1100 may optionally comprise a lateral rim 1105 and an edge termination region 1104 arranged between the active region 1103 and the lateral rim 1105. Different to the active region 1103, the edge termination region 1104 provides for controlled relief of the blocking voltage in the peripheral area of the semiconductor substrate 1100 when the power device 1100 is in the blocking mode. The edge termination region 1104 includes structures such as field rings and field electrodes to shape the electrical field and to avoid local exaggeration of the electrical field strength.

FIG. 7 schematically illustrates vertical transistor cells formed by and between respective gate trenches. Each gate trench includes a gate electrode 1132 which is electrically insulated from the surrounding semiconductor material by a respective gate dielectric 1131. The gate trenches extend from the first surface 1111 to a given depth of the semiconductor substrate 1110. The gate trenches particularly extend through first doping regions 1121, which may form respective source regions, and second doping regions 1122, which may form respective body regions, into a third doping region 1123, which may form the common drift region of the active transistor cells. A fourth doping region 1124 may be formed at the second surface 1112 of the semiconductor substrate 1110. The fourth doping region 1124 may form a drain region in case of a MOSFET and an emitter region in case of an IGBT.

The first doping regions 1121, the second doping regions 1122, the third doping region 1123, and the fourth doping region 1124 may be formed in the semiconductor substrate 1110 in this order from the first surface 1111 to the second surface 1112. Each of the transistor cells may comprise at least one further doping region, which are not shown in FIG. 7. For example, a diode region (sometimes also referred to as "shielding region") may be positioned below at least some of the gate trenches (see also FIG. 11).

In case of a MOSFET, the source regions 1121, the drift region 1123 and the drain region 1124 are of a first conductivity type such as n-type, whereas the body regions 1122 are of a second conductivity type such as p-type. In case of an IGBT, the source regions 1121, which are sometimes also referred to as emitter regions, and the drift region 1123 are of the first conductivity type whereas the body regions 1123 and the emitter region 1124 are of the second conductivity type.

An insulation layer 1140 is arranged on the first surface 1111 of the semiconductor substrate 1110. The insulation layer 1140 can be formed by a single layer or by a layer stack comprising different materials. For example, the insulation layer 1140 may be in direct contact with the semiconductor substrate 1110, for example with the entire first surface 1110 of the semiconductor substrate 1110. In other embodiments (not shown in FIG. 7), a metallization may be in direct contact with at least parts of the first surface 1110. Typically, the insulation layer 1140 is formed by silicon oxide which is deposited by chemical vapour deposition.

The insulation layer 1140 can also form a so-called intermetallic dielectric which is an insulation layer between conductive layers of different levels, such as between the lower polysilicon layer and an upper metallic layer.

Openings 1141 are formed in the insulation layer 1140. The material of the insulation layer 1140 can, for example, surround the respective openings 1141. The openings 1141 typically extend from an upper surface of the insulation layer 1140 to a lower surface of the insulation layer 1140, which lower surface faces the first surface 1111 of the semiconductor substrate 1110.

In the embodiment of FIG. 7, the openings 1141 are depicted as trenches that have a width (i.e., a lateral extent along the first surface 1111) that is essentially smaller than the width of the respective transistor cell (i.e., a lateral distance between neighbouring gate trenches). For example, the opening 1141 may have a width of at most 50%, typically at most 20% or at most 10%, of the width of the transistor cell.

Figure 11:
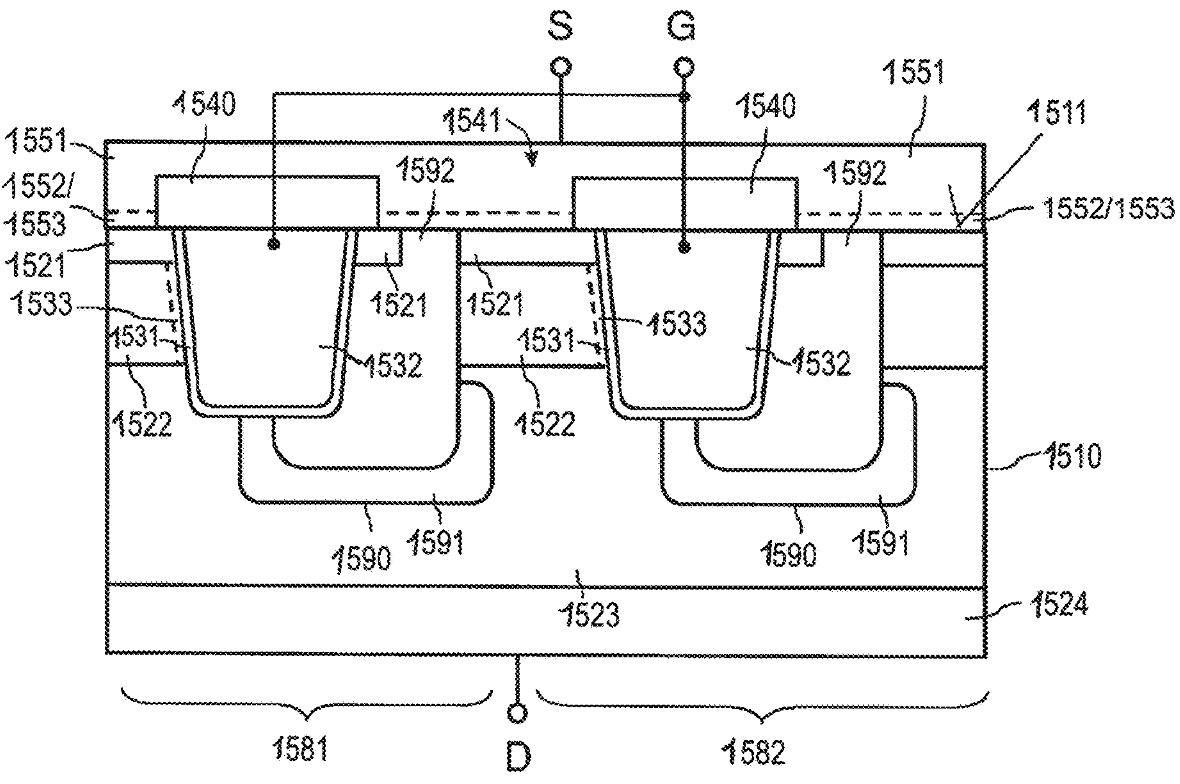
FIG. 11 illustrates a power semiconductor device showing a front metallization according to an embodiment.

In other embodiments, however, the width of the openings 1141 may be at least 70%, typically at least 80%, of the width of the respective transistor cell (see, e.g., the embodiment of FIG. 11). In such a case, an essentially planar contact (e.g., a metallization) from a conductive material may be used for electrically contacting the first doping regions 1121 and/or the second doping regions 1122, for example via an ohmic connection.

The openings 1141 can be formed, for example, by one or more etching processes using an etching mask (not shown in FIG. 7). According to exemplary embodiments, the etching process is adapted to also etch part of the semiconductor substrate 1110 so that contact trenches are formed which extend through the first doping regions 1121 and/or into the second doping regions 1122 of the respective active transistor cells. If the first doping region 1121 is a source region, such a contact extending into the first and/or into the second doping regions 1122 may also be called a source trench. In other embodiments, the etching process is stopped at the first surface 1111 of the semiconductor substrate 1110. In this case, a planar contact may be formed with the first doping regions 1121 and/or the second doping regions 1122 at the first surface 1111.

Each of the openings 1141 and the respective contact trenches are filled with conductive material which form respective plugs 1171, 1172, 1173. The conductive material may form an electrical connection (typically, an ohmic connection) with the first doping regions 1121 and the second doping regions 1122. In other embodiments (not shown in FIG. 7), the conductive material may be applied as a layer on the first surface 1111 of the semiconductor substrate 1110. In general, the conductive material may form an electrical connection (either ohmic or Schottky) with at least one doping region of the semiconductor substrate 1110.

FIG. 7 shows different types of plugs. The semiconductor device 1100 described herein may comprise only one of the shown types of plugs or several different types of plugs. However, as explained before, other types of connectors are possible. The concepts described in connection with the trench plugs of FIG. 7 may also be applicable to other types of connectors, such as a planar connector. Plug 1171 completely fills opening 1141 including the contact trench. The material of plug 1171 can be different to the material of the later formed front metallization 1150. The front metallization 1150 may e.g. comprise two or more layers, e.g. a contact layer and/or a barrier layer structure and/or a metallization layer. Alternatively, as shown at 1172, the plug can be integral with and of the same material as the front metallization 1150. Plug 1172 may be formed together with the front metallization 1150. In a further variation, plug 1173 is also formed by material different to the material of the front metallization 1150 and is in contact with a fifth doping region 1125 formed in the second doping region 1122. The fifth doping region 1125 is of the same conductivity type as the second doping region 1122 but is typically much higher doped than the second doping region 1122 to provide a low ohmic contact between plug 1173 and the second doping region 1122. The fifth doping region 1125 is often referred to as body contact region as it provides a contact to the body region 1122.

The plugs 1171, 1172, 1173 arranged in the respective openings 1141 of the insulation layer 1140 provide metal connections which electrically conductively connect the front metallization 1150 with the semiconductor substrate 1110, for example with the first doping 1121 regions and the second doping regions 1122 of the semiconductor substrate 1110.

The front metallization 1150 is arranged on or above and typically in contact with the insulation layer 1140. The plugs 1171, 1172 and 1173 extend from the front metallization 1152 to the semiconductor substrate 1110 and provide respective ohmic contacts to the respective doping regions of the semiconductor substrate 1110. The insulation layer 1140 is therefore interposed between the front metallization and the first surface 1111 of the semiconductor substrate 1110.

A back metallization 1160 is formed on and in contact with the second surface 1112 of the semiconductor substrate 1110.

The front metallization 1150 and the back metallization 1160 comprise a metal or a metal alloy. The material for the front metallization 1150, in particular the material of a power metal of the front metallization, and the back metallization 1160 can be the same or can be different. Furthermore, both the front metallization 1150 and the back metallization 1160 can be formed by a single material layer or can comprise at least two material layers formed by different metals.

According to an embodiment, the semiconductor substrate 1110 is a so-called wide bandgap semiconductor material made of, for example, SiC, GaN, AlN, and $Ga_2O_3$. SiC and AlN are particularly of interest. The semiconductor material of the semiconductor substrate 1110 has a given intrinsic temperature which is typically at least 600° C., such as at least 1100° C. According to an embodiment, the material used to form the front metallization 1150, in particular at least one layer of the front metallization 1150, is selected such that it has a melting temperature which is higher than the intrinsic temperature of the semiconductor material of the semiconductor substrate 1110. Selecting metals or metal alloys, or layer stacks of metals and metal alloys, which have high melting temperature ensures that the robustness of the power device is not affected by the metallization. This will be described in more detail further below with respect to FIGS. 12 to 14.

According to an embodiment, the front metallization 1150 or at least one layer of the front metallization 1150 contains less than 1% by weight, relative to the total amount of the front metallization, of a metal having a lower melting temperature than the intrinsic temperature of the semiconductor material of the semiconductor substrate 1110. For example, the front metallization 1150 may be free of aluminum, or only less than 1% aluminum by weight.

In addition to that, in some embodiments, the front metallization 1150 can also be free of copper (except for impurities due to manufacturing) or less than 1% copper by weight. Both aluminum and copper are widely used materials for forming thick front and also back metallization. However, both metals including alloys formed by these metals have a comparably low melting temperature which is typically below the intrinsic temperature of wide bandgap semiconductor materials. This may be particularly the case for SiC as a main material of the semiconductor substrate.

According to an embodiment, the front metallization 1150 contains or essentially consists of, one or more metals or a metal alloys selected from the group consisting of Ti, TiN, TiW, V, Nb, Ta, TaN, Mo, W, WN, NiAl, Mo, MoN, Cu, Hf, HfN, and layer combinations or alloy compositions thereof.

More details and aspects of the examples shown in FIG. 7 are mentioned in connection with the proposed concept or one or more examples described above or below (e.g. FIGS. 1 to 6*e*, 8 to 14). The examples shown in connection with FIG. 7 may comprise one or more additional optional features corresponding to one or more aspects of the proposed concept or one or more examples described above or below.

Figure 8:
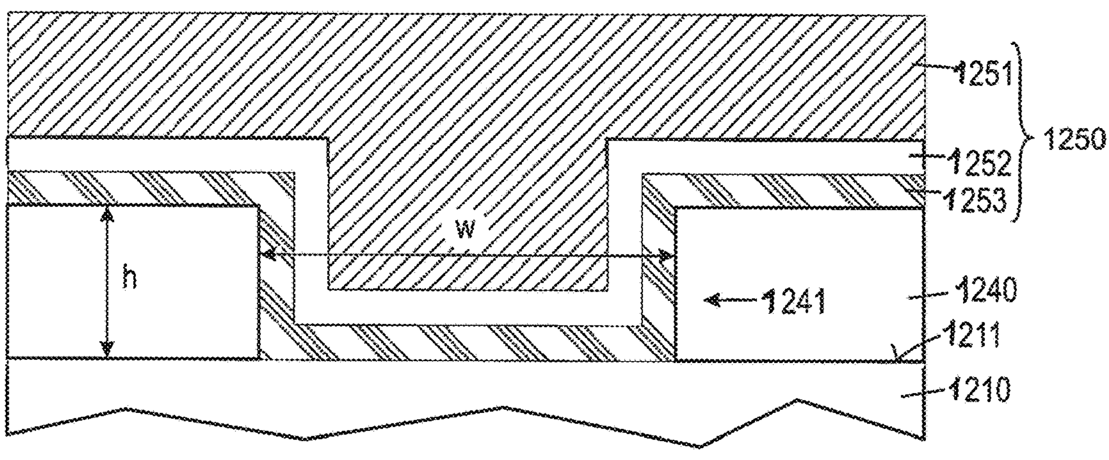
FIG. 8 illustrates an enlarged portion of a power semiconductor device showing a front metallization according to an embodiment.

With respect to FIG. 8, an enlarged portion of a power device having a front metallization 1250 according to an embodiment is shown. The insulation layer 1240, which can be a silicon dioxide layer, is arranged on or above the first surface 1211 of the semiconductor substrate 1210. In variation of this and other embodiments, the insulation layer 1240 can be arranged on a conductive layer such as a polysilicon layer or a metal layer and forms in this case an intermetallic dielectric.

An opening 1241 is formed in the insulation layer 1240 and extends to and exposes the first surface 1211 of the semiconductor substrate 1210 within the opening 1241. The opening 1241 has a given width w, when seen in a vertical cross-section perpendicular to the first surface 1211 of the semiconductor substrate 1210. The width w can correspond to the diameter of the opening 1241. The insulation layer 1240 can have a given thickness h in a vertical direction perpendicular to the first surface 1211 of the semiconductor substrate 1110.

According to an embodiment, the thickness h of the insulation layer 1240 can be about 1 μm, and more generally between about 800 nm and about 2 μm. The width w of the opening 1241 can be from about 200 nm to about 1 μm, and more generally from about 150 nm to about 2 μm.

As shown in FIG. 8, the front metallization 1250 includes an integral plug or a metal connection extending through the opening 1241 to come in contact with the first surface 1211 of the semiconductor substrate 1210. Even though an integral plug is shown in the embodiment of FIG. 8, other types of plugs may be possible.

According to an embodiment, the front metallization 1250 contains at least one contact layer 1253 (e.g. a contact layer as shown in connection with FIG. 1) in direct contact with the semiconductor substrate 1110 (e.g. a silicon carbide substrate), an adhesion promotion layer 1252 (e.g. a barrier layer structure as shown in connection with FIG. 1) being different to the contact layer 1253 on the contact layer 1253, and a power metal 1251 (e.g. a metallization layer as shown in connection with FIG. 1) on and in contact with the adhesion promotion layer 1252, wherein the power metal is at least 5 times thicker than each of the contact layer 1253 and the adhesion promotion layer 1252. Instead of or in addition to providing the adhesion promotion layer 1252, a barrier layer structure may be provided in the front metallization 1250, for example. Instead of or in addition to providing the power metal 1251, a metallization layer may be provided in the front metallization 1250, for example.

In a more specific embodiment, the front metallization 1250 includes three material layers. A lower layer, which is in direct contact with the semiconductor substrate 1210, forms a so-called contact layer 1253. On the contact layer 1253, an adhesion layer 1252 (and/or a barrier layer structure) is arranged, followed by a so-called power metal 1251 (and/or a metallization layer). The adhesion layer 1252 is thus interposed between the contact layer 1253 and the power metal 1251. In other embodiments, the metallization 1250 may include more material layers (e.g. an additional barrier layer structure and/or an additional metallization layer). For example, an additional adhesion layer (e.g. an additional barrier layer structure) may be interposed between the contact layer 1253 and the power metal 1251. In yet other embodiments, the metallization 1250 may comprise fewer material layers. According to an embodiment as exemplified in FIG. 8, the contact layer 1253 is formed in the opening 1141 and on the insulation layer 1140, particularly on the sidewalls of the opening 1141 and on the upper surface of the insulation layer 1140. In embodiment, the contact layer 1253 may be formed only in the opening 1141.

According to an embodiment, the power metal 1251 can be formed by a metal or metal alloy selected from the group consisting of Ti, Mo, W, Hf, nitrides of these metals, and a layer combination or alloy composition thereof. The power metal can be essentially free of aluminum such as having an aluminum content of less than 1% in weight, for example less than 0.5% of aluminum in weight. The power metal 1251 forms a comparatively thick metal layer which is significantly thicker than each of the adhesion layer 1252 and the contact layer 1253, respectively. For example, the power metal 1251 can have a thickness of about at least 3 μm, typically in the range of about 3 μm to about 30 μm.

More generally, the front metallization 1250 can include at least one layer having a thickness of at least 1 μm, particularly of at least 2 μm, more particularly of at least 3 μm. The at least one layer can be formed by a metal or metal alloy selected from the group consisting of Ti, Mo, W, Hf, nitrides of these metals, and a layer combination or alloy composition thereof. The at least one metal layer can be the power metal 1251.

The above metals and metal nitrides have a high melting temperature. For example, Ti has a melting temperature of 1668° C., Mo has a melting temperature of 2623° C., W has a melting temperature of 3422° C., Hf has a melting temperature of 2233° C., TiN has a melting temperature of 2950° C., and MoN has a melting temperature of 1750° C.

In at least one embodiment, copper (Cu) may be used as a front metallization. In this case, the semiconductor material typically has an intrinsic temperature of at least 600° C., but of at most 1000° C. For example, the semiconductor material then may be GaAs or Si. Cu has a melting temperature of 1084° C. and could be used in principle as well, provided that no Al-containing intermediate layers are used.

In addition to the high melting temperature provided by the above mentioned metals, a further benefit can be seen in the fact that the above metals including alloys thereof have a thermal expansion coefficient which is similar to the thermal expansion coefficient of the semiconductor material, for example, SiC. Since the operational temperature of the power device can significantly vary and can reach high temperatures, a suitable match of the thermal expansion coefficient of the thick power metal 1251 and the semiconductor substrate 1210 is desirable to reduce mechanical tensions caused by transient thermal impact. In addition to that, the adhesion layer 1252 can partially absorb a mismatch of the thermal expansion coefficients of the power metal 1251 and the semiconductor substrate 1210. This further reduces mechanical tensions caused by varying thermal conditions.

For example, the thermal expansion coefficient of Mo is about $4.8\times10^{-6}\ K^{-1}$, the thermal coefficient of W is about $4.3\times10^{-6}\ K^{-1}$, and the thermal coefficient of 4H-SiC is about $4.5\times10^{-6}\ K^{-1}$, which makes Mo and W particularly suitable for SiC-based and 4H-SiC-based power devices having a semiconductor substrate 1210 formed of SiC or 4H-SiC. In addition to that, the conductivity of Mo and W is sufficiently high (about 50% relative to the conductivity of aluminum) to be suitable for a power metallization.

The adhesion layer 1252 (e.g. barrier layer structure) can be formed, according to an embodiment, by a metal or metal alloy selected from the group consisting of TiN, TiW, MoN, Ta, and a layer combination or alloy composition thereof. The thickness of the adhesion layer 1252 can be rather small, for example in the range between about 20 nm to about 500 nm, particularly between about 50 nm to about 500 nm. The main purpose of the adhesion layer 1252 is to improve adhesion between the power metal 1251 and the contact layer 1253.

According to an embodiment, a thin barrier layer can optionally be arranged between the adhesion layer 1252 and the contact layer 1253. For example, the barrier layer can have a thickness of about 5 nm. In further embodiments, an additional barrier layer is not needed as the material of the adhesion layer 1252 may also act as a barrier against unwanted metal diffusion.

According to an embodiment, the contact layer 1253 is formed by a metal or a metal alloy selected from the group consisting of Ti, V, Nb, Ta, Mo, W. Ni, NiAl, and a layer combination or alloy composition thereof. Typically, the adhesion layer 1252 and the contact layer 1253 are formed of different metals or metal alloys. The contact layer 1253 can be thinner than the adhesion layer 1252. For example, the contact layer 1253 can have a thickness of about 100 nm, more generally between about 20 nm to about 140 nm.

The material of the contact layer 1253 can be selected such that it allows the formation of a binary, ternary or quaternary alloy systems of at least one of the chemical elements of the semiconductor material of the semiconductor substrate 1210 and at least one of the chemical elements of the material of the contact layer 1253. Such an alloy system may be positioned directly between the semiconductor substrate 1210 and the contact layer 1253. By allowing for formation of such an alloy system, a contact resistance between the semiconductor material of the semiconductor substrate 1210 and the contact layer 1253 may be reduced, thus enabling a low ohmic contact. Instead of providing an ohmic contact, the formation of a Schottky contact between the contact layer 1253 and the semiconductor substrate 1210 is also desired in certain embodiments described herein.

For example, the chemical elements of the semiconductor material are Si and C in the case of SiC as a semiconductor material or Ga and N in the case of GaN as a semiconductor material. The chemical elements of the material of the contact layer 1253 may be Ni and Al for NiAl as an exemplary material of the contact layer 1253 or Ti and W for TiW as an exemplary material of the contact layer 1253. For example, in the case of SiC as a semiconductor material, so-called silicidation of the material of the material of the contact layer 1253 may occur.

The contact layer 1253 may include NiAl with a comparable low aluminum content. It may be possible that a comparable low aluminum content reduces or prevents melting of the contact layer 1253 at temperatures below the intrinsic temperature of the semiconductor substrate 1210. For example, the aluminum content can be less than 1%, based on weight, of the total weight of the contact layer 1253.

As seen in FIG. 8, the contact layer 1253 conforms with the shape of the insulation layer 1240 and covers both an upper surface of the insulation layer 1240 as well as sidewalls of the opening 1241. The contact layer 1253 is also in direct contact with the upper surface 1211 of the semiconductor substrate without any further layer interposed between the contact layer 1253 and the upper surface 1211. The adhesion layer 1252 completely covers the contact layer 1253 and is therefore also formed on the upper surface of the insulation layer 1240 and on the sidewalls of the opening 1241. The power metal 1251 is formed on the adhesion layer 1252 and extends into the opening 1241. The portion of the front metallization 1250 which extends into the opening 1241 can be described as an integral plug or integral metal connection of the front metallization 1250. As described further above in connection with FIG. 7, it would also be possible to form the plugs or metal connections separate to the front 1250.

Each of the contact layer 1253 and the adhesion layer 1252 can be formed using a chemical vapour deposition (CVD) process, a physical vapour deposition (PVD) process, reactive sputtering or an atomic layer deposition (ALD) process. The power metal 1251 can be formed by CVD or physical vapour deposition (PVD) processes. For example, V and Mo are typically deposited using a PVD process while W is deposited using CVD process with $WF_6$ being the tungsten source gas. Ti and TiN may, for example, be deposited using PVD or CVD.

According to an embodiment, a suitable metal layer stack for the contact layer 1253, the adhesion layer 1252, and the power metal 1251 is free of a metal nitride for the power metal 1251. An exemplary metal layer stack includes Ti for the contact layer 1253, TiN, TiW or Ta for the adhesion layer 1252, and V, W or Mo for the power metal 1251.

According to a further variation, a solder is formed on the power metal 1251, for example a sinterable solder material to facilitate external connection to the power metal 1251.

Different to previous approaches, Ti, Mo, W, Hf, and nitrides of these metals are used as power metal 1251. In previous approaches, these metals were used exclusively for barrier or adhesion layers as in the case of, for example, copper metallization. The power metal 1251 is formed comparably thick and typically at least five times thicker than each of the contact layer 1253 and the adhesion layer 1252. In further embodiments, the power metal layer 1251 is formed at least 10 times thicker than each of the contact layer 1253 and the adhesion layer 1252.

According to embodiments described herein, a temporary strong increase of the temperature of the semiconductor device 1240 is absorbed by the front metallization 1250 which essentially consists of metals having a melting temperature higher than the intrinsic temperature of the semiconductor material of the semiconductor substrate 1210. Therefore, even a strong increase of the temperature does not lead to a partial melting of the front metallization 1250. A transient temperature increase mainly occurs at or close to the first surface 1211 of the semiconductor substrate 1210, and therefore the front metallization 1250 is particularly subjected to strong temperature variations. To absorb also longer lasting temperature increases, the back metallization can also be formed of metals or metal alloys having a melting temperature higher than the intrinsic temperature of the semiconductor substrate 1210. Alternatively, the back metallization 1160 can be made particularly thick so that the back metallization 1160 functions as thermal sink with improved heat dissipation.

In previous approaches, the front metallization 1250 has been made comparably thick to absorb or to level out temporal temperature increases. A thicker front metallization has a higher volume and can therefore absorb more energy. This effectively improves heat dissipation. However, these approaches are only partially effective as the material used for the front metallization may start to melt when the temperature peaks are either higher or last longer. Therefore, providing a thick front metallization may only partially addresses the problem and may lead to other problems due to the thickness of the metallization.

Different thereto, the approach presented herein provides a front metallization which can withstand even long lasting and high temperature peaks as the metal and metal alloys used for forming the front metallization are high-melting metals. The expected robustness of the power device may therefore not be affected by the used metallization unlike previous approaches. It is believed that power devices employing high-melting metals as described herein can tolerate temperature peaks better than power devices which employs other metals.

In addition to the front metallization, the above-described metals for the front metallization 1250 can also be used to form gate electrodes or other metal structures of the power device. It is desirable that all metal structures of the power device are formed of or comprised of metals, metal alloys and metal nitrides having a melting temperature higher than the intrinsic temperature of the semiconductor material of the semiconductor substrate. For example, all metal structures of the power device can be free of aluminum, or have an aluminum content of less than 1% by weight.

If gate electrodes are formed by any of these high melting metals or metal alloys, the gate electrodes can be formed as a metal layer stack as described above in connection with the front metallization. Alternatively, the gate electrodes can comprise only two metal layers or only a single metal layer since the gate electrodes typically does not make direct contact to the semiconductor substrate and are electrically insulated from the semiconductor substrate by at least the gate dielectric.

Moreover, the power device can include a plurality of gate electrodes electrically insulated from the semiconductor substrate by respective gate dielectrics and/or at least one metal structure selected from the group consisting of a gate runner, a gate pad, a source runner, a source pad, a field electrode, a channel stopper electrode, and combinations thereof, wherein the gate electrodes and/or at least one metal structure comprises, or essentially consists of, one or more metals or a metal alloys selected from the group consisting of Ti, TiN, TiW, V, Nb, Ta, TaN, Mo, W, WN, NiAl, Mo, MoN, Cu, Hf, HfN, and layer combinations or alloy compositions thereof. In particularly, each metal structure can be substantially free of aluminum, for example having an aluminum content of the less than 1% by weight or less than 0.5%, relative to the total amount of the respective metal structure. More generally, the content of a metal having a melting temperature lower than 1100° C. can be less than 1% by weight or less than 0.5%, relative to the total amount of the respective metal structure.

According to embodiments described herein, the front metallization 1150 comprises or essentially consists of one or more metals and/or metal alloys having a melting temperature higher than 1100° C.

According to embodiments described herein, the power device further includes a plurality of gate electrodes 1132 electrically insulated from the semiconductor substrate 1110 by respective gate dielectrics 1131, wherein each of the gate electrodes 1132 comprises, or essentially consist of, one or more metals or a metal alloys having a melting temperature higher than 1100° C.

According to embodiments described herein, the front metallization 1150 extends through respective openings 1141 of the insulation layer 1140 and forms respective metal connections 1171, 1172, 1173 arranged in the respective openings 1141 of the insulation layer 1140. The metal connections 1171, 1172, 1172 form respective electrical connections to the semiconductor substrate 1110. Each conductive structure formed or arranged at the first surface 1111 of the semiconductor substrate 1110 can essentially consist of a metal or a metal alloy having a melting temperature higher than 1100° C.

According to embodiments described herein, each of the metal structures of the semiconductor device comprises less than 1% by weight, relative to the total amount of the respective metal structure, of a metal having a melting temperature lower than 1100° C.

The front metallization 1150 can essentially consists of, one or more metals or a metal alloys selected from the group consisting of Ti, TiN, TiW, V, Nb, Ta, TaN, Mo, W. WN, NiAl, Mo, MoN, Cu, Hf, HfN, and layer combinations or alloy compositions thereof.

More details and aspects of the examples shown in FIG. 8 are mentioned in connection with the proposed concept of one or more examples described above or below (e.g. FIGS. 1 to 7, 9 to 14). The examples shown in connection with FIG. 8 may comprise one or more additional optional features corresponding to one or more aspects of the proposed concept or one or more examples described above or below.

Figure 9:
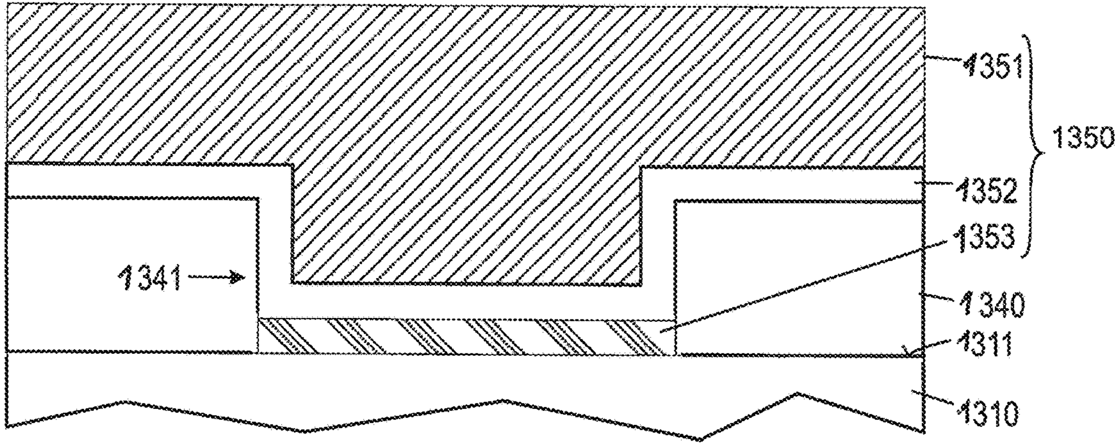
FIG. 9 illustrates an enlarged portion of a power semiconductor device showing a front metallization according to an embodiment.

FIG. 9 illustrates a variation of the embodiment of FIG. 8. The contact layer 1353 is only formed in the opening 1141 of the insulation layer 1140, more particularly only at the bottom of the opening 1341 to be in direct contact with the first surface 1311 which is not covered by the insulation layer 1340 surrounding the opening. The adhesion layer 1352 (e.g. barrier layer structure) therefore comes into contact with the material of the insulation layer 1340 at the sidewalls of the opening 1341. The power metal 1351 (e.g. metallization layer) is formed on and in contact with the adhesion layer 1352. As with the embodiment of FIG. 8, the power metal 1351, the adhesion layer 1352, and the contact layer 1353 form together the front metallization 1350.

More details and aspects of the examples shown in FIG. 9 are mentioned in connection with the proposed concept of one or more examples described above or below (e.g. FIGS. 1 to 8, 10 to 14). The examples shown in connection with FIG. 9 may comprise one or more additional optional features corresponding to one or more aspects of the proposed concept or one or more examples described above or below.

Figure 10:
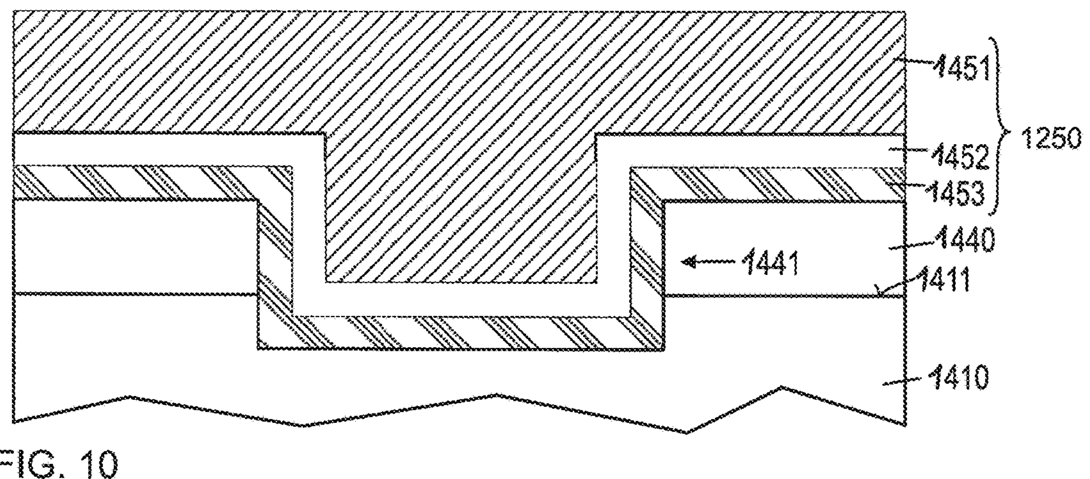
FIG. 10 illustrates an enlarged portion of a power semiconductor device showing a front metallization according to an embodiment.

FIG. 10 illustrates a further variation of the embodiment of FIG. 8. During etching of the opening 1441, the exposed semiconductor substrate 1410 is also partially etched so that the opening 1441 extends into the semiconductor substrate 1410 to form a contact trench. The bottom of this contact trench is below the first surface 1411 of the semiconductor substrate 1410. The contact layer 1453 completely covers the insulation layer 1440, the sidewalls of the opening 1441 and of the contact trench, and the bottom of the contact trench. The adhesion layer 1453 (e.g. barrier layer) is completely formed on and covers the contact layer 1453, while being completely covered by the power metal 1451 (e.g. metallization layer).

More details and aspects of the examples shown in FIG. 10 are mentioned in connection with the proposed concept of one or more examples described above or below (e.g. FIGS. 1 to 9, 11 to 14). The examples shown in connection with FIG. 10 may comprise one or more additional optional features corresponding to one or more aspects of the proposed concept or one or more examples described above or below.

FIG. 11 illustrates a vertical cross sectional view of a power device, specifically of a vertical semiconductor device, and more specifically of a vertical power transistor device with an optional integrated diode. The semiconductor device includes a semiconductor substrate 1510 and at least two transistor cells 1581, 1582 integrated in the semiconductor substrate 1510. In FIG. 11, only two transistor cells 1581, 1582 are illustrated. However, the power device may include more than two transistor cells each arranged in the active area of the power device.

Each transistor cell 1581, 1582 includes a drift region 1523, a source region 1521 and a body region 1522. The body region 1522 is arranged between the source region 1521 and the drift region 1523. In the embodiment of FIG. 11, as in the embodiment of FIG. 13, the individual transistor cells 1581, 1582 have a common drift region 1523.

Each transistor cell 1581, 1582 may optionally include a diode region 1590. The diode region 1590 may shield a gate dielectric 1531 of a gate electrode 1532 from high electrical fields present during operation of the power device, in particular by reducing the electrical field at the gate dielectric 1531 by exploiting a FET effect.

A pn-junction is formed between the optional diode region 1590 and the drift region 1523. The diode region 1590 may be a p-doped region. The diode region 1590, when present, may comprise a first diode region 1591 and a second diode region 1592 above the first diode region 1591. However, different to the embodiment shown in FIG. 11, the diode region 1590 may be a single region with a varying doping profile, in particular varying along the vertical direction. For example, the diode region 1590 may have a high doping concentration in an upper region, i.e. closer to the first surface 1511, than in a lower region, i.e. closer to the bottom of the trench in which the gate electrode 1532 is arranged. For example, the upper region corresponds to the second doping region 1592 and the lower region corresponds to the first doping region 1591.

Although FIG. 11 illustrates the second diode region 1592 to be laterally larger than the first diode region 1591, both the first diode region 1591 and the second diode region 1592 can have, in the cross-sectional view of FIG. 11, the same lateral extension according to an embodiment. In a further variation of embodiments described herein, the first diode region 1591 and the second diode region 1592 can be formed as a single common diode region.

The common diode region, or at least one of the first diode region 1591 and the second diode region 1592 or both of the first diode region 1591 and the second diode region 1592 can also be arranged partially or completely below the trench.

Each transistor cell 1581, 1582 further includes a gate electrode 1532 arranged in a trench and dielectrically insulated from the body region 1522, the (optional) diode region 1590, and the drift region 1523 by a gate dielectric 1531. The trench may extend along the direction that projects into the drawing plane. The trench with the gate electrode 1532 of each transistor cell 1581, 1582 has, in the cross-section illustrated in FIG. 11, a first sidewall, a second sidewall opposite the first sidewall, and a bottom. The body region 1522 of each transistor cell 1581, 1582 adjoins the first sidewall of the corresponding trench, the (optional) diode region 1590 adjoins the second sidewall of the corresponding trench, and the pn junction between the drift region 1523 and the (optional) diode region 1590 adjoins the bottom of the corresponding trench. The source region 1521 of the respective transistor cell may laterally be arranged at both sides of the trench to be in contact with the gate dielectric 1531. Alternatively, the source region 1521 of the respective transistor cell may only be formed at one of the sides of the trench, for example at the respective left side of the trench opposite to the side where the second diode region 1592 is formed.

A channel region 1533 extends in the body region 1522 along the first sidewall of the respective trench of the transistor cells 1581, 1582.

The (optional) diode region 1590 of each transistor cell 1581, 1582 extends from a first surface 1511 of the semiconductor substrate 1510 adjacent to the source region 1521 and the body region 1522 of a neighbouring transistor cell, into the drift region 1523 where the pn-junction is formed. An electrically insulating layer (insulation layer) 1540 covers the first surface 1511 and the gate electrodes 1532. The insulation layer 1540 has openings 1541 where the insulation layer 1540 uncovers (optional) second diode regions 1592 and the source regions 1521 of the individual transistor cell 1581, 1582.

Different to the embodiment shown in FIG. 11, the diode region 1590 may also be positioned entirely below the trench, either along the entire trench extension or at parts of the trench. In this case, the channel region 1533 may extend along the first sidewall and along a second sidewall opposite the first sidewall of the trench. For example, a diode region 1590 below a trench may be contacted with an electrically conductive material positioned in the trench and electrically insulated from the gate electrode 1532. The electrically conductive material may at least partially be positioned below the gate electrode 1532 and/or adjacent the gate electrode along the extension direction of the gate electrode 1532.

In other embodiments of the power device, the diode region 1590 may be located at a different position, in particular distanced to the trench having the gate electrode 1532. For example, the diode region 1590 may be positioned between neighbouring trenches. In this case, a bottom of the diode region 1590 may have a larger distance to the first surface 1511 than a bottom of the trench having the gate electrode 1532. That is to say, the diode region 1590 may have a larger vertical extent than the trench having the gate electrode 1532.

A front metallization comprising a power metal 1551, an adhesion layer 1552, and a contact layer 1553 is formed on the insulation layer 1540 and extends into the openings 1541 to come into contact with the second diode regions 1592 and the source regions 1521.

The front metallization is in contact with a source terminal S. The gate electrodes 1532 are in contact with a gate terminal G. A drain region 1524 formed at the second surface of the semiconductor substrate 1510 is in contact with a drain terminal D.

Figure 12:
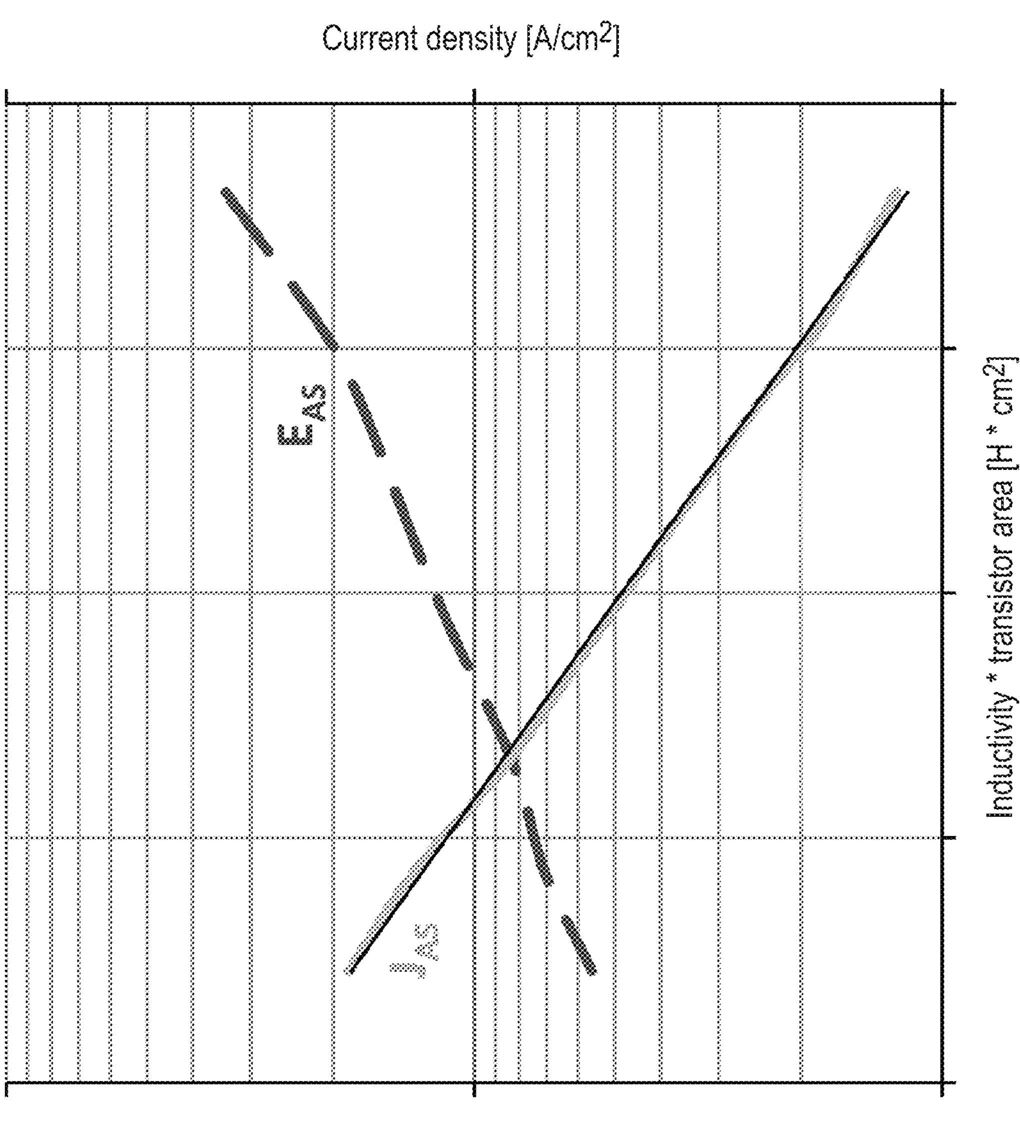
FIG. 12 illustrates the dependency of the destructive avalanche current and the converted energy during avalanche relative to the driving inductivity.
Figure 13:
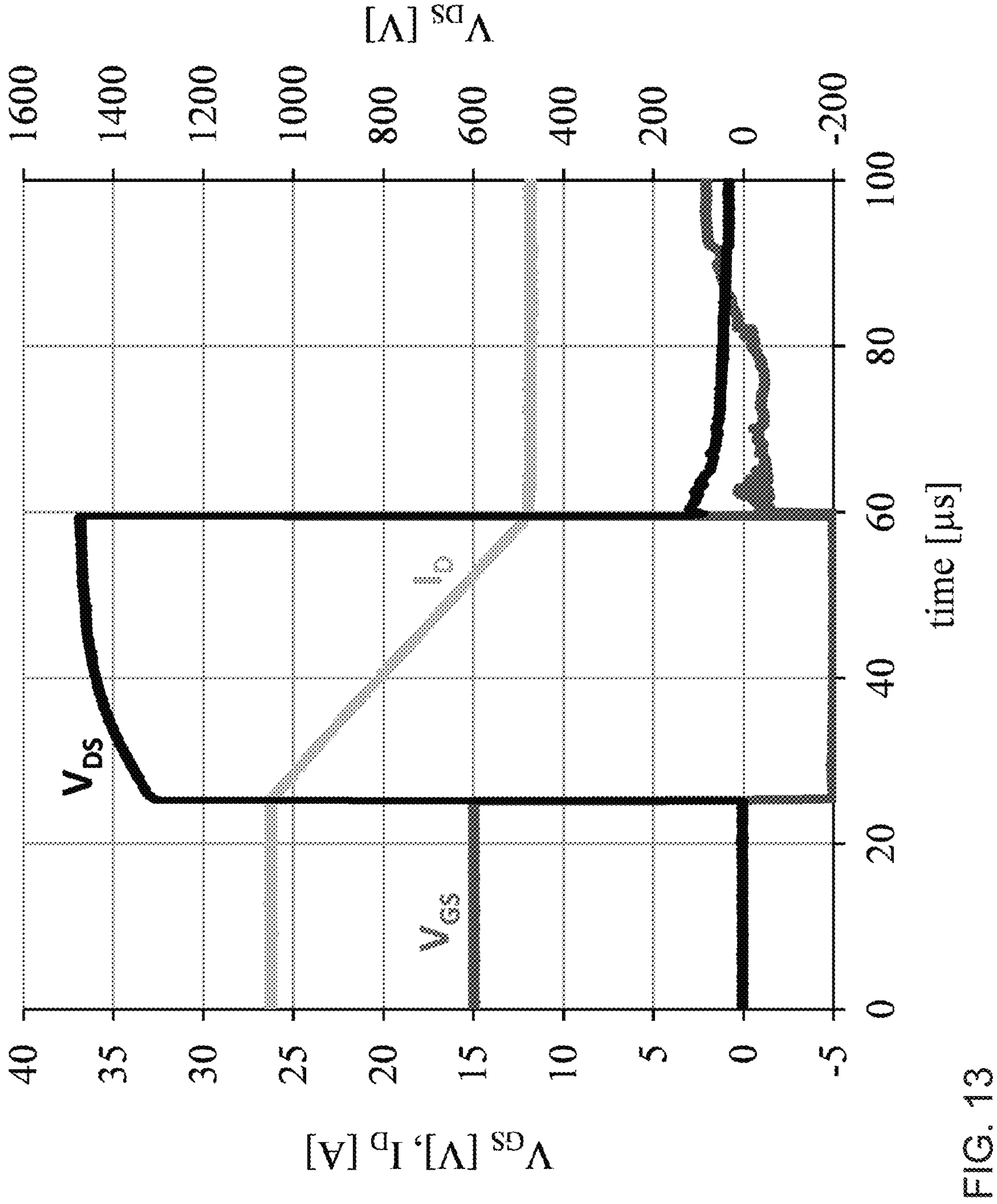
FIG. 13 illustrates an example of a destructive avalanche test of a SiC-MOSFET.
Figure 14:
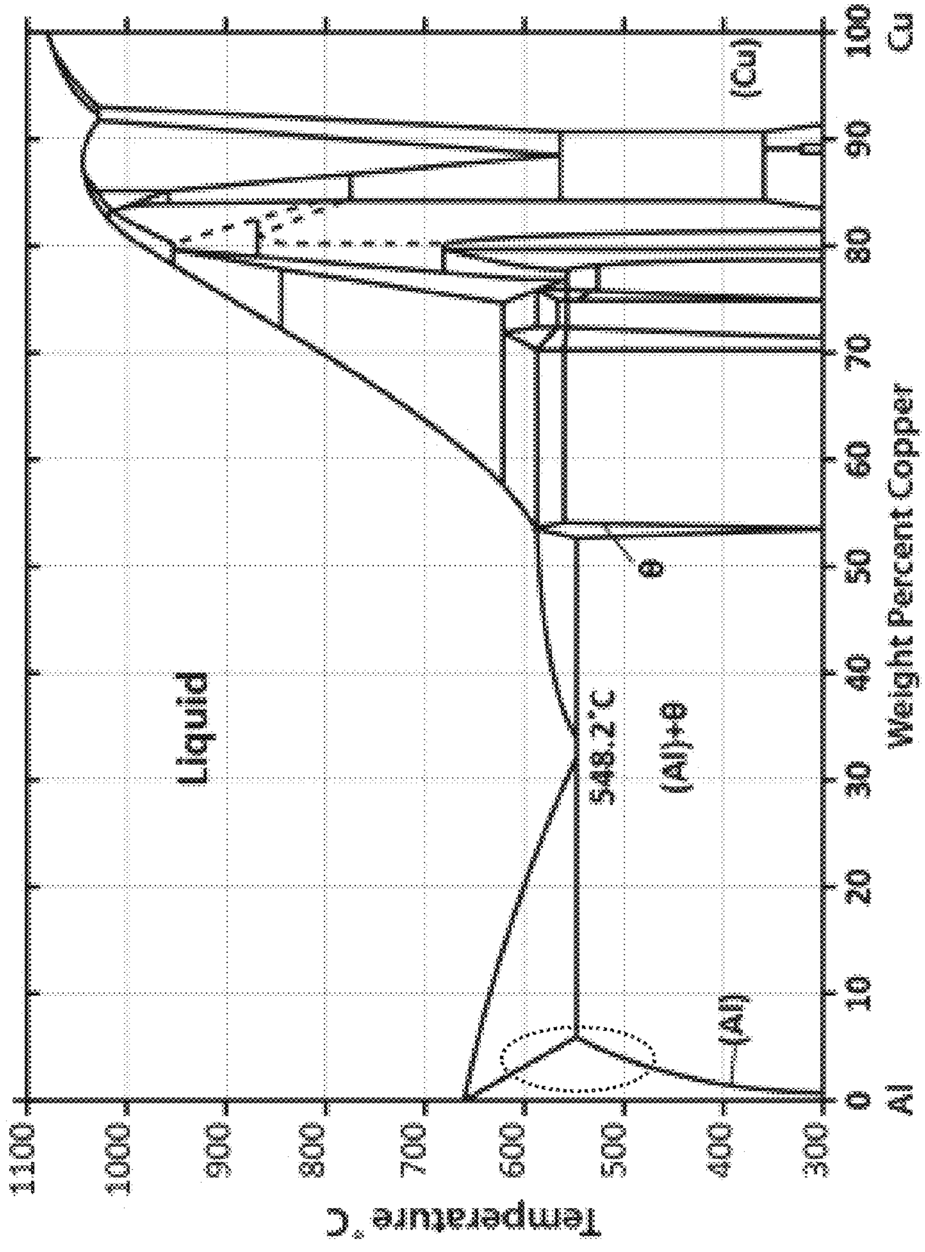
FIG. 14 illustrates an AlCu phase diagram.

With reference to FIGS. 12 to 14, further aspects are explained with reference to a SiC power device.

More details and aspects of the examples shown in FIG. 11 are mentioned in connection with the proposed concept of one or more examples described above or below (e.g. FIGS. 1 to 10, 12 to 14). The examples shown in connection with FIG. 11 may comprise one or more additional optional features corresponding to one or more aspects of the proposed concept or one or more examples described above or below.

FIG. 12 illustrates measurement of the avalanche destruction current $J_{AS}$ and the energy $E_{AS}$ supplied to a common power device by an induction load during avalanche. The resulting dependency approximately corresponds to the expected dependency from the inductive load which can be described by the following relation:

$$I_{AS} \sim A^{2/3} \cdot (T_j - T_0)^{2/3} \cdot L^{-1/3} \cdot BV_i^{-1/3} \cdot \left(1 - \frac{V_{dd}}{BV_i}\right)^{-1/3}$$

with $I_{AS}$ being the avalanche current, A the active chip area approximately corresponding to the active area, $T_i$ the junction temperature, $T_0$ the ambient temperature, L the avalanche inductive load, $BV_i$ the rated breakdown voltage of the power device, and $V_{dd}$ the voltage of the voltage source.

FIG. 13 illustrates a destructive avalanche measurement. Using the electrical values provided by the measurement and the material parameters of SiC, the increase of the temperature during the avalanche pulse can be estimated. This also allows estimation of the temperature at which the power device is destructed according to the following relation:

$$\Delta T_{j,max} \approx \frac{\sqrt{2}}{3} K \cdot BV_i \cdot I_{AS} \sqrt{t_{av}}$$

$$K = \frac{2}{A\sqrt{\pi \cdot k \cdot c \cdot \rho}}$$

with $T_{j,max}$ being the maximum junction temperature, $t_{av}$ the time during avalanche, k the specific thermal conductivity of SiC, c the specific thermal capacity of SiC, and ρ the density of SiC.

Using the above relations and the material properties of SiC, particularly of 4H-SiC, a destruction temperature of about 600° C. to about 650° C. is estimated. This temperature is well below the intrinsic temperature of SiC at which intrinsic conduction dominates which results in the destruction of the power device. The reduction of the destruction temperature is attributed to the use of low-melting metals such as aluminum in common SiC-power devices.

For illustration purposes, the phase diagram of a AlCu alloy is illustrated in FIG. 14 showing that commonly used AlCu alloys having a high Al content, as indicated by the dashed ellipse, has a comparably low melting temperature which is well below of the intrinsic temperature of SiC.

Hence, the benefits provided by SiC, and other wide bandgap materials, cannot fully be exploited when using inappropriate metallization.

The present disclosure aims at overcoming this drawback by using high melting metals and metal alloys which allows to fully exploit the capabilities of wide bandgap materials. The robustness of power devices can be significantly increased.

In particular, the robustness against single thermal peaks, caused by, for example, avalanche breakdown and short-circuiting can be improved by using only high-melting materials for the front metallization. For further improvement of the robustness to tolerate, for example, repeating avalanches (repetitive avalanche), the back metallization can also be comprised of high-melting materials only.

Further examples relate to further aspects of the present disclosure.

Example 1 relates to a power semiconductor device, comprising a semiconductor substrate 1110 having a first surface 1111, the semiconductor substrate 1110 comprising a wide bandgap semiconductor material having an intrinsic temperature, an insulation layer 1140 above the first surface 1111 of the semiconductor substrate 1110, the insulation layer 1140 comprising at least one opening 1141 extending through the insulation layer 1140 in a vertical direction, a front metallization 1150 above the insulation layer 1140 with the insulation layer 1140 being interposed between the front metallization 1150 and the first surface 1111 of the semiconductor substrate 1110, a metal connection 1171, 1172, 1173 arranged in the opening 1141 of the insulation layer 1140 and electrically conductively connecting the front metallization 1150 with the semiconductor substrate 1110, wherein the front metallization 1150 comprises at least one layer or essentially consists of one layer, wherein the at least one layer essentially consists of a metal or a metal alloy having a higher melting temperature than the intrinsic temperature of the semiconductor material.

Example 2 relates to a power semiconductor device of example 1, wherein the intrinsic temperature of the semiconductor material is at least 600° C., particularly at least 1100° C.

Example 3 relates to a power semiconductor device of example 1, wherein the intrinsic temperature of the semiconductor material is at least 600° C. and less than 1000° C.

Example 4 relates to a power semiconductor device of any of the examples 1 to 3, wherein the semiconductor substrate comprises SiC as a main material.

Example 5 relates to a power semiconductor device of any of the examples 1 to 4, wherein the front metallization 1150 comprises less than 1% by weight, relative to the total amount of the front metallization, of a metal having a lower melting temperature than the intrinsic temperature.

Example 6 relates to a power semiconductor device of any of the examples 1 to 5, wherein the front metallization 1250 comprises at least one contact layer 1253 in direct contact with the semiconductor substrate 1110, an adhesion promotion layer 1252 being different to the contact layer 1253 on the contact layer 1253, and a power metal 1251 on and in contact with the adhesion promotion layer 1252, the power metal being at least 5 times thicker than each of the contact layer 1253 and the adhesion promotion layer 1252.

Example 7 relates to a power semiconductor device of example 6, wherein the contact layer 1253 is formed only in the opening 1141 of the insulation layer 1140.

Example 8 relates to a power semiconductor device of example 6, wherein the contact layer 1253 is formed in the opening 1141 and on the insulation layer 1140.

Example 9 relates to a power semiconductor device of any of the examples 6 to 8, wherein the contact layer 1253 is formed with a metal or a metal alloy selected from the group consisting of Ti, V, Nb, Ta, Mo, W, Ni, NiAl, and a layer combination or alloy composition thereof.

Example 10 relates to a power semiconductor device of any of the examples 6 to 9, wherein the adhesion promotion layer 1252 is formed with a metal or metal alloy selected from the group consisting of TiN, TiW, MoN, Ta, and a layer combination or alloy composition thereof.

Example 11 relates to a power semiconductor device of any of the examples 6 to 10, wherein the power metal 1251 is formed by a metal or metal alloy selected from the group consisting of Cu, Ti, Mo, W, Hf, nitrides of these metals, and a layer combination or alloy composition thereof.

Example 12 relates to a power semiconductor device of any of the previous examples, further comprising a plurality of gate electrodes 1132 electrically insulated from the semiconductor substrate 1110 by respective gate dielectrics 1131, wherein each of the gate electrodes 1132 comprises, or essentially consists of, one or more metals or a metal alloys selected from the group consisting of Ti, TiN, TiW, V, Nb, Ta, TaN, Mo, W, WN, NiAl, Mo, MoN, Cu, Hf, HfN, and layer combinations or alloy compositions thereof.

Example 13 relates to a power semiconductor device of any of the previous examples, further comprising at least one metal structure selected from the group consisting of a gate runner, a gate pad, a source runner, a source pad, a field electrode, a channel stopper electrode, and combinations thereof, wherein the at least one metal structure comprises, or essentially consists of, one or more metals or a metal alloys selected from the group consisting of Ti, TiN, TiW, V, Nb, Ta, TaN, Mo, W, WN, NiAl, Mo, MoN, Cu, Hf, HfN, and layer combinations or alloy compositions thereof.

Example 14 relates to a power semiconductor device of any of the previous examples, wherein the at least one layer of the front metallization 1150 has a thickness of at least 1 μm.

Example 15 relates to a power semiconductor device, comprising a semiconductor substrate 1110 having a first surface 1111, the semiconductor substrate 1110 comprising a monocrystalline semiconductor material selected from a group consisting of SiC, GaN, AlN and $Ga_2O_3$, an insulation layer 1140 on the first surface 1111 of the semiconductor substrate 1110, the insulation layer 1140 comprising a plurality of openings 1141 extending through the insulation layer 1140, a front metallization 1150 on the insulation layer 1140 with the insulation layer 1140 being interposed between the front metallization 1150 and the first surface 1111 of the semiconductor substrate 1110, the front metallization 1150 extending through the respective openings 1141 of the insulation layer 1140 and forming respective metal connections 1171, 1172, 1173 arranged in the respective openings 1141 of the insulation layer 1140, the metal connections 1171, 1172, 1172 forming respective electrical connections to the semiconductor substrate 1110, wherein the front metallization 1150 comprises or essentially consists of one or more metals and/or metal alloys having a melting temperature higher than 1100° C.

Example 16 relates to a power semiconductor device of example 15, further comprising a plurality of gate electrodes 1132 electrically insulated from the semiconductor substrate 1110 by respective gate dielectrics 1131, wherein each of the gate electrodes 1132 comprises, or essentially consist of, one or more metals or a metal alloys having a melting temperature higher than 1100° C.

Example 17 relates to a power semiconductor device of example 15 or 16, wherein each conductive structure formed or arranged at the first surface 1111 of the semiconductor substrate 1110 essentially consist of a metal or a metal alloy having a melting temperature higher than 1100° C.

Example 18 relates to a power semiconductor device of any of the examples 15 to 17, wherein the front metallization 1150 essentially consists of, one or more metals or a metal alloys selected from the group consisting of Ti, TiN, TiW, V, Nb, Ta, TaN, Mo, W, WN, NiAl, Mo, MoN, Cu, Hf, HfN, and layer combinations or alloy compositions thereof.

Example 19 relates to a power semiconductor device of any of the examples 15 to 18, further comprising at least one metal structure selected from the group consisting of a gate runner, a gate pad, a source runner, a source pad, a field electrode, a channel stopper electrode, and combinations thereof, wherein the at least one metal structure comprises, or essentially consists of, one or more metals or a metal alloys selected from the group consisting of Ti, TiN, TiW, V. Nb, Ta, TaN, Mo, W, WN, NiAl, Mo, MoN, Cu, Hf, HfN, and layer combinations or alloy compositions thereof.

Example 20 relates to a power semiconductor device of any of the examples 15 to 19, wherein each of the metal structures of the semiconductor device comprises less than 1% by weight, relative to the total amount of the respective metal structure, of a metal having a melting temperature lower than 1100° C.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A silicon carbide device, comprising:

a silicon carbide substrate;

a contact layer located on the silicon carbide substrate and comprising nickel and silicon;

a barrier layer structure comprising titanium and tungsten; and a metallization layer comprising copper, wherein the contact layer is located between the silicon carbide substrate and at least a part of the barrier layer structure, wherein the barrier layer structure is located between the silicon carbide substrate and the metallization layer, wherein the metallization layer is configured as a contact pad of the silicon carbide device, wherein silicon is present within the contact layer throughout a vertical thickness of the contact layer, wherein the barrier layer structure forms a direct interface with the contact layer.

2. The silicon carbide device of claim 1, wherein the barrier layer structure comprises a TiW layer.

3. The silicon carbide device of claim 2, wherein the TiW layer contacts the metallization layer.

4. The silicon carbide device of claim 1, wherein the barrier layer structure comprises a TiWN layer.

5. The silicon carbide device of claim 4, wherein the TiWN layer contacts the metallization layer.

6. The silicon carbide device of claim 1, wherein the barrier layer structure contacts the contact layer.

7. The silicon carbide device of claim 1, wherein the barrier layer structure comprises a Ti/TiN layer, and/or a TiW layer, and/or a TiWN layer, and/or a MON layer.

8. The silicon carbide device of claim 1, wherein the barrier layer structure comprises a Ti/TiN layer.

9. The silicon carbide device of claim 8, wherein the Ti/TiN layer contacts the contact layer.

10. The silicon carbide device of claim 8, wherein the barrier layer structure further comprises a TiW layer and/or a TiWN layer.

11. The silicon carbide device of claim 8, wherein a titanium layer of the Ti/TiN layer contacts the contact layer.

12. The silicon carbide device of claim 1, wherein a vertical thickness of the barrier layer structure is at least 100 nm and at most 600 nm.

13. The silicon carbide device of claim 1, wherein the contact layer comprises at least 1% and at most 20% silicon by volume.

14. The silicon carbide device of claim 1, wherein the contact layer comprises at most 10% carbon inclusions by volume.

15. The silicon carbide device of claim 1, wherein the contact layer is in ohmic contact with a first doping region of the silicon carbide substrate and/or with a second doping region of the silicon carbide substrate, wherein the first doping region has a first conductivity type, and wherein the second doping region has a second conductivity type.

16. The silicon carbide device of claim 1, wherein the metallization layer comprises at least 60% copper by volume.

17. The silicon carbide device of claim 1, wherein the metallization layer is at least 5 times thicker than each of the contact layer and the barrier layer structure.

18. The silicon carbide device of claim 1, further comprising a bondwire bonded to the metallization layer.

19. The silicon carbide device of claim 18, wherein the bondwire has a diameter of at most 100 μm.

20. The silicon carbide device of claim 18, wherein the bondwire is a copper bondwire.

21. The silicon carbide device of claim 1, further comprising a gate contact pad or a sense contact pad at least partially formed by the metallization layer, wherein a lateral surface area of the gate contact pad or sense contact pad is at most 200 μm by 200 μm.

22. The silicon carbide device of claim 1, wherein at least one of a transistor structure and/or a diode structure of the silicon carbide device has a breakdown voltage of more than 100V.

23. The silicon carbide device of claim 1, wherein a lateral dimension of the contact pad is at least 100 μm, and wherein a vertical thickness of the of the contact pad is at most 100 μm.

24. The silicon carbide device of claim 1, wherein an atomic ratio of Ni and Si within the contact layer varies at most by 5% in a vertical direction throughout the vertical thickness of the contact layer.

* * * * *